(12) United States Patent
Nakamura et al.

(10) Patent No.: US 11,798,970 B2
(45) Date of Patent: Oct. 24, 2023

(54) SEMICONDUCTOR APPARATUS AND EQUIPMENT

(71) Applicant: CANON KABUSHIKI KAISHA, Tokyo (JP)

(72) Inventors: Kohichi Nakamura, Kawasaki (JP); Yoshikazu Yamazaki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/866,691

(22) Filed: Jul. 18, 2022

(65) Prior Publication Data

US 2022/0359600 A1  Nov. 10, 2022

Related U.S. Application Data

(63) Continuation of application No. 16/798,929, filed on Feb. 24, 2020, now Pat. No. 11,424,282.

(30) Foreign Application Priority Data

Feb. 25, 2019 (JP) .................................. 2019-031801
Dec. 19, 2019 (JP) .................................. 2019-229328

(51) Int. Cl.

| H01L 27/146 | (2006.01) |
| H01L 23/00 | (2006.01) |
| H01L 23/522 | (2006.01) |
| H01L 49/02 | (2006.01) |
| H04N 25/75 | (2023.01) |
| H04N 25/778 | (2023.01) |

(52) U.S. Cl.
CPC .... *H01L 27/14634* (2013.01); *H01L 23/5225* (2013.01); *H01L 24/45* (2013.01); *H01L 27/14636* (2013.01); *H01L 28/60* (2013.01); *H04N 25/75* (2023.01); *H04N 25/778* (2023.01)

(58) Field of Classification Search
CPC .......... H01L 27/14634; H01L 23/5225; H01L 24/45; H01L 27/14636; H01L 28/60
See application file for complete search history.

(56) References Cited

U.S. PATENT DOCUMENTS

| 2014/0042582 A1 | 2/2014 | Kondo |
| 2016/0219239 A1 | 7/2016 | Itoh |
| 2017/0069677 A1 | 3/2017 | Saruwatari |
| 2019/0181177 A1* | 6/2019 | Kobayashi ........ H01L 27/14634 |

FOREIGN PATENT DOCUMENTS

| JP | 2013016963 A | 1/2013 |
| WO | 2017187738 A1 | 11/2017 |

* cited by examiner

*Primary Examiner* — Tony Ko
(74) *Attorney, Agent, or Firm* — Venable LLP

(57) ABSTRACT

A semiconductor apparatus of the present disclosure includes: a first semiconductor component in which a first circuit unit is provided; and a second semiconductor component in which a second circuit unit is provided and which is stacked to the first semiconductor component, and the second semiconductor component includes a capacitor unit as a decoupling capacitor having a first node and a second node that are connected to the first circuit unit.

50 Claims, 20 Drawing Sheets

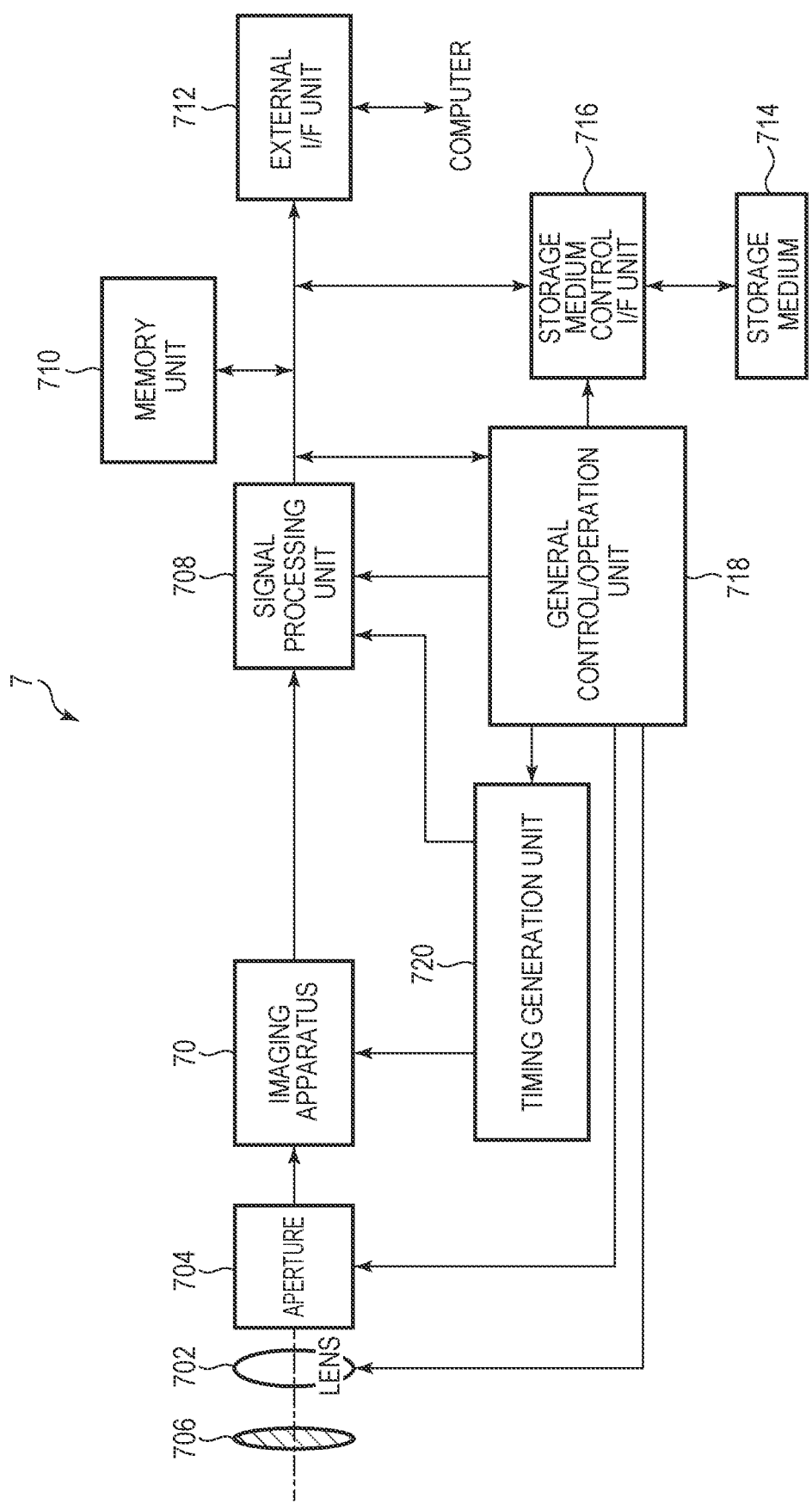

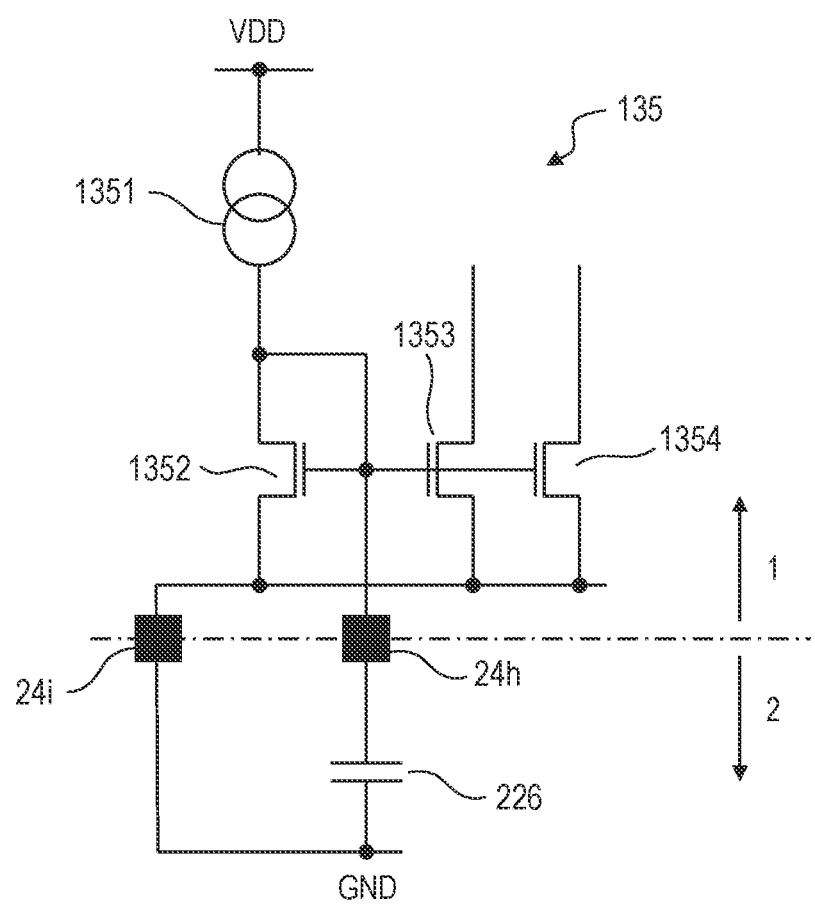

SEMICONDUCTOR APPARATUS AND EQUIPMENT

CROSS-REFERENCE TO RELATED APPLICATIONS

This application is a Continuation of U.S. patent application Ser. No. 16/798,929, filed Feb. 24, 2020, which claims priority to Japanese Patent Application Nos. 2019-031801 filed Feb. 25, 2019, and 2019-229328 filed Dec. 19, 2019. The entire contents of these applications are hereby incorporated by reference herein.

BACKGROUND OF THE INVENTION

Field of the Invention

The present invention relates to a semiconductor apparatus and an equipment.

Description of the Related Art

In recent years, solid state imaging apparatuses in which a plurality of semiconductor components are stacked have been proposed. A solid state imaging apparatus disclosed in International Publication No. WO2017/187738 has a plurality of stacked components, a pixel unit is provided in a first component, and a reading unit that reads a signal of a pixel unit is provided in a second component. In addition to the first component and the second component, a component specific to a bypass capacitor is stacked.

SUMMARY OF THE INVENTION

In the solid state imaging apparatus disclosed in the above reference, a component specific to a bypass capacitor has to be stacked, and there is a problem of increased manufacturing cost.

According to one embodiment of the present disclosure, provided is a semiconductor apparatus including: a first semiconductor component in which a first circuit unit is provided; and a second semiconductor component in which a second circuit unit is provided and which is stacked to the first semiconductor component, the second semiconductor component includes a capacitor unit as a decoupling capacitor having a first node and a second node that are connected to the first circuit unit, and the first circuit unit is a signal processing circuit that processes a signal output from the second circuit unit.

According to another embodiment of the present disclosure, provided is a semiconductor apparatus including: a first semiconductor component in which a first circuit unit is provided; and a second semiconductor component in which a second circuit unit is provided and which is stacked to the first semiconductor component, the second semiconductor component includes a capacitor unit having a first node and a second node that are connected to the first circuit unit, and the second semiconductor component further includes a shield portion provided between the second circuit unit and the capacitor unit.

According to yet another embodiment of the present disclosure, provided is a semiconductor apparatus including: a first semiconductor component in which a first circuit unit is provided; and a second semiconductor component in which a second circuit unit is provided and which is stacked to the first semiconductor component, the second semiconductor component includes a capacitor unit as a decoupling capacitor having a first node and a second node that are connected to the first circuit unit, and the capacitor unit is formed of a semiconductor region and a polysilicon electrode formed on the semiconductor region via an insulating film.

According to yet another embodiment of the present disclosure, provided is a semiconductor apparatus including: a first semiconductor component in which a first circuit unit is provided; and a second semiconductor component in which a second circuit unit is provided and which is stacked to the first semiconductor component, the second semiconductor component includes a capacitor unit having a first node and a second node that are connected to the first circuit unit, and the second circuit unit is a pixel unit including a plurality of pixels, and the capacitor unit is arranged outside the pixel unit in plan view.

According to the present invention, it is possible to efficiently arrange a capacitor unit while suppressing an increase in manufacturing cost of a semiconductor apparatus.

Further features of the present invention will become apparent from the following description of exemplary embodiments with reference to the attached drawings.

BRIEF DESCRIPTION OF THE DRAWINGS

FIG. 11 is a block diagram illustrating a general configuration of an imaging system according to a seventh embodiment of the present invention.

FIG. 20 is a schematic diagram of a current mirror circuit in the ninth embodiment of the present invention.

DESCRIPTION OF THE EMBODIMENTS

First Embodiment

A semiconductor apparatus of the present embodiment is applicable to an imaging apparatus including a photoelectric conversion unit, for example. The embodiment will be described below with an example of an imaging apparatus.

Figure 1:
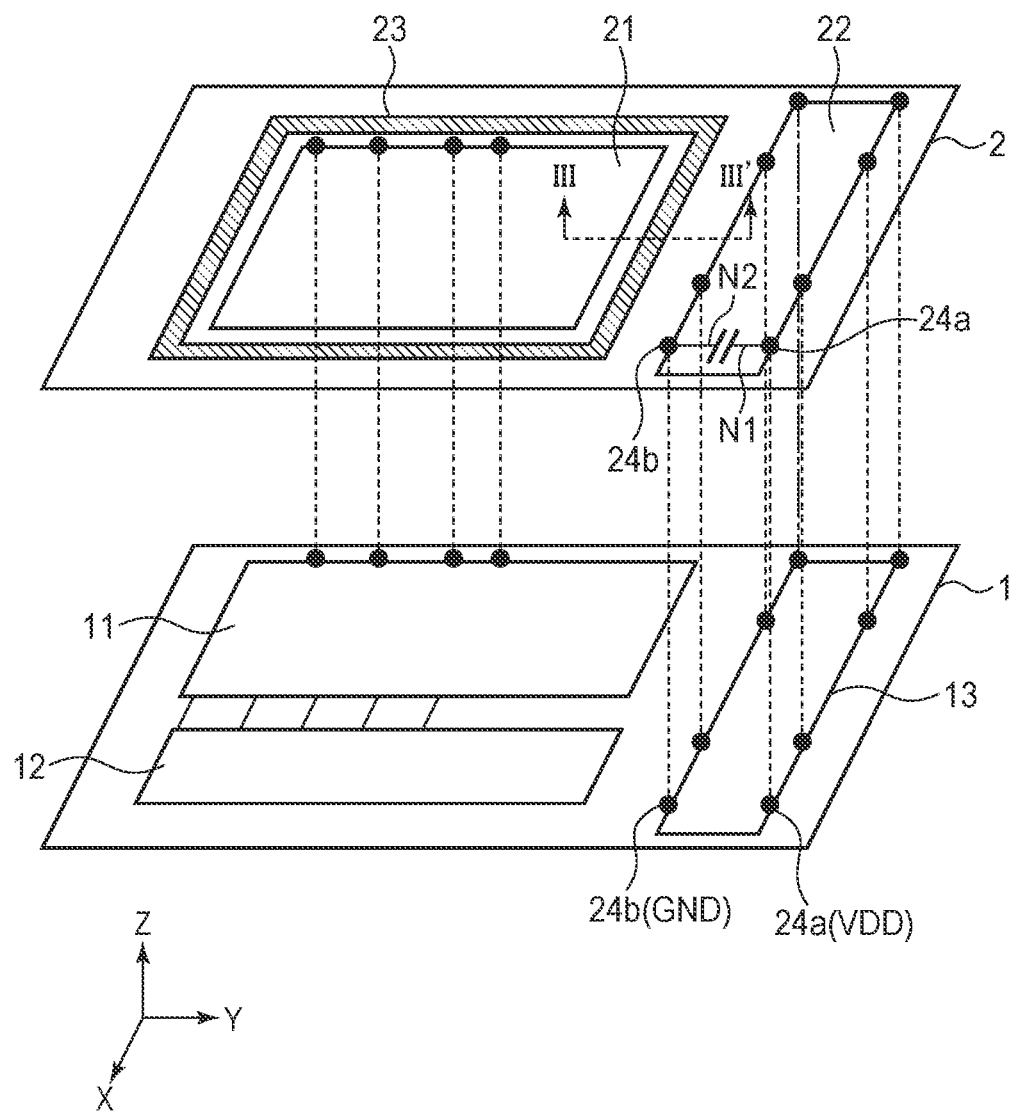
FIG. 1 is a schematic diagram of an imaging apparatus in a first embodiment of the present invention.

FIG. 1 is a schematic diagram of the imaging apparatus of the present embodiment. The imaging apparatus is a so-called backside irradiation solid state imaging apparatus and includes a first semiconductor component 1 and a second semiconductor component 2. The second semiconductor component 2 is stacked on a first primary face (the upper face in the Z direction) of the first semiconductor component 1. Such a semiconductor apparatus is manufactured by attaching a wafer including the first semiconductor component 1 and a wafer including the second semiconductor component 2 to each other at the wafer level and dicing the attached wafers. Because of being obtained by dicing, each of the first semiconductor component 1 and the second semiconductor component 2 can be referred to as a semiconductor chip. As a manufacturing method without involving attachment at a wafer level, a semiconductor chip obtained by dicing a wafer including the first semiconductor component 1 may be stacked on a semiconductor chip obtained by dicing a wafer including the second semiconductor component 2. The first semiconductor component 1 includes an analog-to-digital conversion unit 11, a memory unit 12, and a signal processing unit 13, for example, as a first circuit unit. The second semiconductor component 2 includes a pixel unit 21, for example, as a second circuit unit that is different from the first circuit unit. The pixel unit 21 includes a plurality of pixels that generate signals in accordance with an incident light, and the plurality of pixels are arranged in a matrix in the X direction and the Y direction. Signals output from the pixel unit 21 are output to the analog-to-digital conversion unit 11 of the first semiconductor component 1. The analog-to-digital conversion unit 11 converts signals from the pixel unit 21 into digital signals, and the memory unit 12 holds the digital signals. The signal processing unit 13 processes digital signals held in the memory unit 12. The analog-to-digital conversion unit 11 and the memory unit 12 form a third circuit unit, and at least a part of the analog-to-digital conversion unit 11 and the memory unit 12 may be arranged so as to overlap the second circuit unit in plan view in the Z direction.

The second semiconductor component 2 further includes a capacitor unit 22. The capacitor unit 22 is connected to the signal processing unit 13, for example, in the first semiconductor component 1. The capacitor unit 22 and the signal processing unit 13 are electrically connected via junction contacts 24a and 24b made of a metal such as Al, Cu, or W. The capacitor unit 22 includes a first input node N1 and a second input node N2 and is connected to the signal processing unit 13. When the capacitor unit 22 is used as a bypass capacitor (decoupling capacitor), the first input node N1 is connected to a power source line VDD of the signal processing unit 13, and the second input node is connected to a ground line GND of the signal processing unit 13. Further, when the capacitor unit 22 is used as a coupling capacitor, the capacitor unit 22 may be connected to a desired signal line of the signal processing unit 13 in series. The configuration in which the capacitor unit 22 includes a bypass capacitor will be mainly described below.

The capacitor unit 22 may be formed at a position facing the signal processing unit 13 in the second semiconductor component 2 in plan view. That is, the capacitor unit 22 and the signal processing unit 13 may be arranged so as to be at least partially overlapped with each other in plan view of the imaging apparatus. Thereby, a wiring between the capacitor unit 22 and the signal processing unit 13 is shortened, the impedance of the power source line and the ground line can be reduced. Note that, even when the capacitor unit 22 and the signal processing unit 13 are not overlapped with each other in arrangement in plan view, it is preferable to reduce the lengths of the power source line and the ground line between the capacitor unit 22 and the signal processing unit 13 as much as possible.

In the second semiconductor component 2, a shield portion 23 is formed between the pixel unit 21 and the capacitor unit 22. The shield portion 23 may form an annular rectangle surrounding the pixel unit 21 in plan view. The shield portion 23 includes a plurality of wirings as described later and can prevent noise occurring in the capacitor unit 22 from being mixed in the pixel unit 21.

Figure 2:
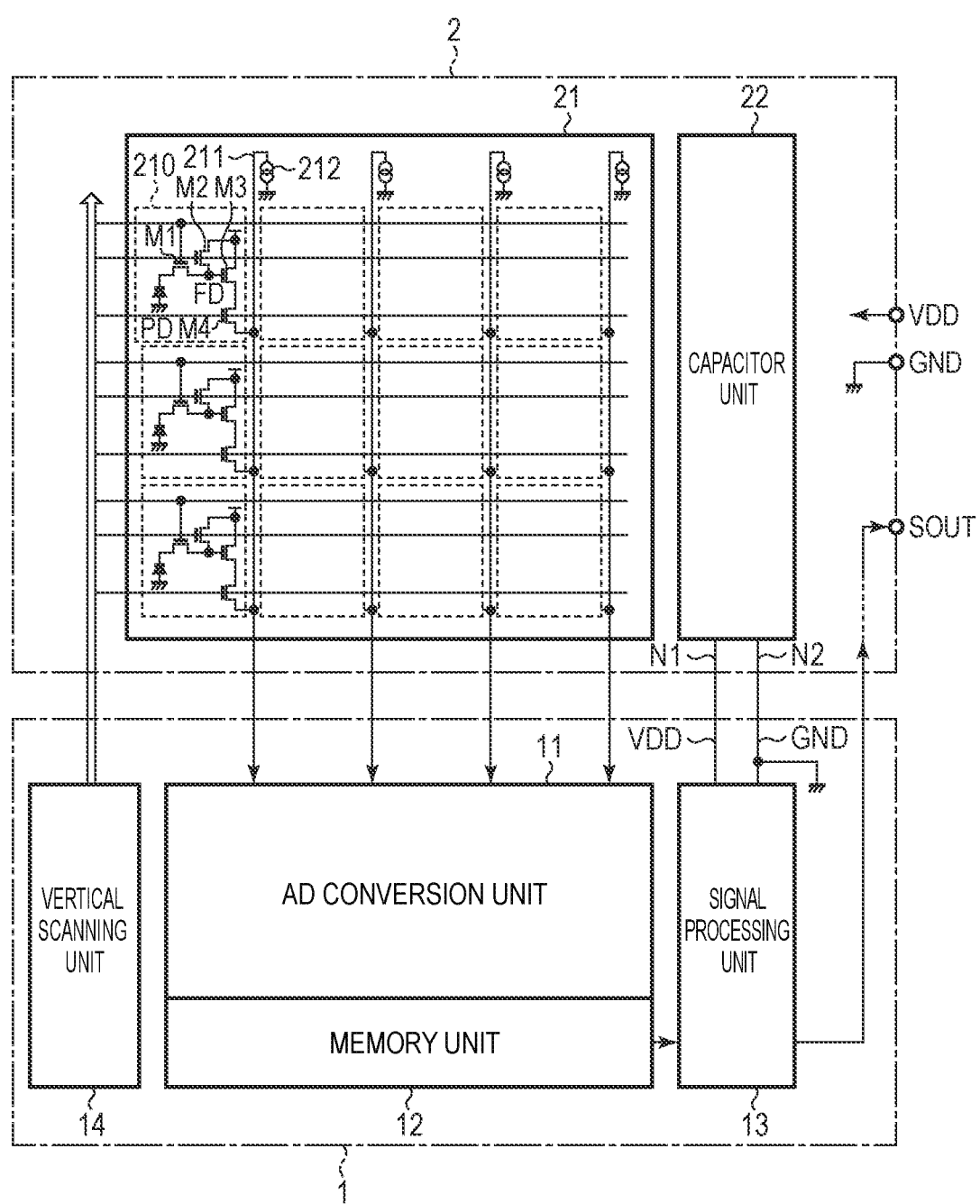
FIG. 2 is a block diagram of the imaging apparatus in the first embodiment of the present invention.

FIG. 2 is a block diagram of the imaging apparatus of the present embodiment. The imaging apparatus includes the pixel unit 21, the analog-to-digital conversion unit (AD conversion unit) 11, the memory unit 12, the signal processing unit 13, and a vertical scanning unit 14, and the capacitor unit 22.

The pixel unit 21 is provided in the second semiconductor component 2 and has a plurality of pixels 210 arranged in a matrix. While the pixels 210 of three rows by four columns are illustrated in FIG. 2 for simplified illustration, the number of pixels 210 arranged in the row direction and the column direction is not particularly limited. Note that, in the present specification, the row direction represents the horizontal direction in the drawing, and the column direction represents the vertical direction in the drawing. A micro-lens and a color filter may be arranged on each pixel 210. The color filters are primary color filters of red, blue, and green, for example, and are provided on respective pixels 210 in accordance with the Bayer arrangement. Some pixels 210 are shielded from light as OB pixels (optical black pixels). In the plurality of pixels 210, a ranging row on which focus detection pixels that output pixel signals used for focus detection are arranged and a plurality of imaging rows on which imaging pixels that output pixel signals used for generating an image are arranged may be provided. Signal lines 211 are provided for each column of the pixels 210, and a constant current source 212 is electrically connected to each signal line 211.

Each pixel 210 includes a photoelectric conversion unit PD, a floating diffusion region FD, a transfer transistor M1, a reset transistor M2, an amplifier transistor M3, and a select transistor M4. The following description illustrates an example in which each transistor forming the pixel 210 is an N-type MOS transistor. The photoelectric conversion unit PD is formed of a photodiode, for example, and performs photoelectric conversion with an incident light and generation and accumulation of charges. When the transfer transistor M1 is turned on, the transfer transistor M1 transfers charges of the photoelectric conversion unit PD to the floating diffusion region FD. When the reset transistor M2 is turned on, the reset transistor M2 resets a potential of the floating diffusion region FD to a power source voltage. The floating diffusion region FD has a predetermined capacitance and generates a voltage in accordance with charges. The amplifier transistor M3 operates as a source follower in which the potential of the source changes in accordance with the potential of the floating diffusion region FD. The select transistor M4 electrically connects the source of the amplifier transistor M3 to the signal line 211. The constant current source 212 that functions as a load of the amplifier transistor M3 is connected to the signal line 211. When the select transistor M4 on a row to be read is turned on, the voltage (analog signal) in accordance with charges of the photoelectric conversion unit PD on the row is output to the signal line 211.

Each of the transistors M1 to M4 is not limited to the N-type MOS transistor but may be a P-type MOS transistor. The configuration of the pixel 210 is not limited to the example illustrated in FIG. 2, and various pixels may be used. For example, a plurality of photoelectric conversion units PD may share one amplifier transistor M3, or the pixel 210 may include an overflow drain that drains charges overflown from the photoelectric conversion unit PD.

The analog-to-digital conversion unit 11 includes an amplifier circuit, a comparator, a ramp signal generation circuit, a counter circuit, or the like. The amplifier circuit amplifies an analog signal output from the pixel 210 to the signal line 211 and inputs the amplified analog signal to one of the input terminals of the comparator. The ramp signal generation circuit generates a ramp signal that changes with time and inputs the ramp signal to the other input terminals of the comparator. The comparator compares an analog signal with a ramp signal and outputs a comparison signal. The counter circuit counts time from the time when the ramp signal starts changing to the time when the comparison signal is inverted and outputs the count value as digital data.

The memory unit 12 holds digital data output from the analog-to-digital conversion unit 11. The memory unit 12 may hold digital data on a row basis or a frame basis. Furthermore, the memory unit 12 may include a scanning circuit that outputs the held digital data as serial data or parallel data.

The signal processing unit 13 includes a digital signal processing circuit, an operation processing circuit, or the like and performs signal processing of digital data output from the memory unit 12. The signal processing may be any one or a plurality of a noise reduction process, a dynamic range expansion process, a white balance process, a shutter reading process, and a demosaic process, for example. Digital data output from the signal processing unit 13 is output from a pad electrode SOUT of the second semiconductor component 2 to the outside of the imaging apparatus.

The vertical scanning unit 14 includes a shift register, a gate circuit, or the like and supplies a plurality of control signals to the pixel 210. That is, the vertical scanning unit 14 drives control signals applied to the gates of the transistors M1, M2, and M4 of the pixels 210 and reads the pixels 210 on a row basis.

The capacitor unit 22 is provided in the second semiconductor component 2, the first input node N1 of the capacitor unit 22 is connected to the power source wiring VDD of the signal processing unit 13, and the second input node N2 of the capacitor unit 22 is connected to the ground wiring GND of the signal processing unit 13. The power source wiring VDD and the ground wiring GND are electrically connected to external pad electrodes VDD and GND of the second semiconductor component 2, and the power source voltage is supplied thereto from the outside of the semiconductor apparatus via the external pad electrodes VDD and GND.

Note that a power source control circuit may be provided between the external pad electrodes VDD and GND and each circuit unit inside the semiconductor apparatus. The power source control circuit may control the power source voltage supplied to each component of the semiconductor apparatus.

Figure 3:
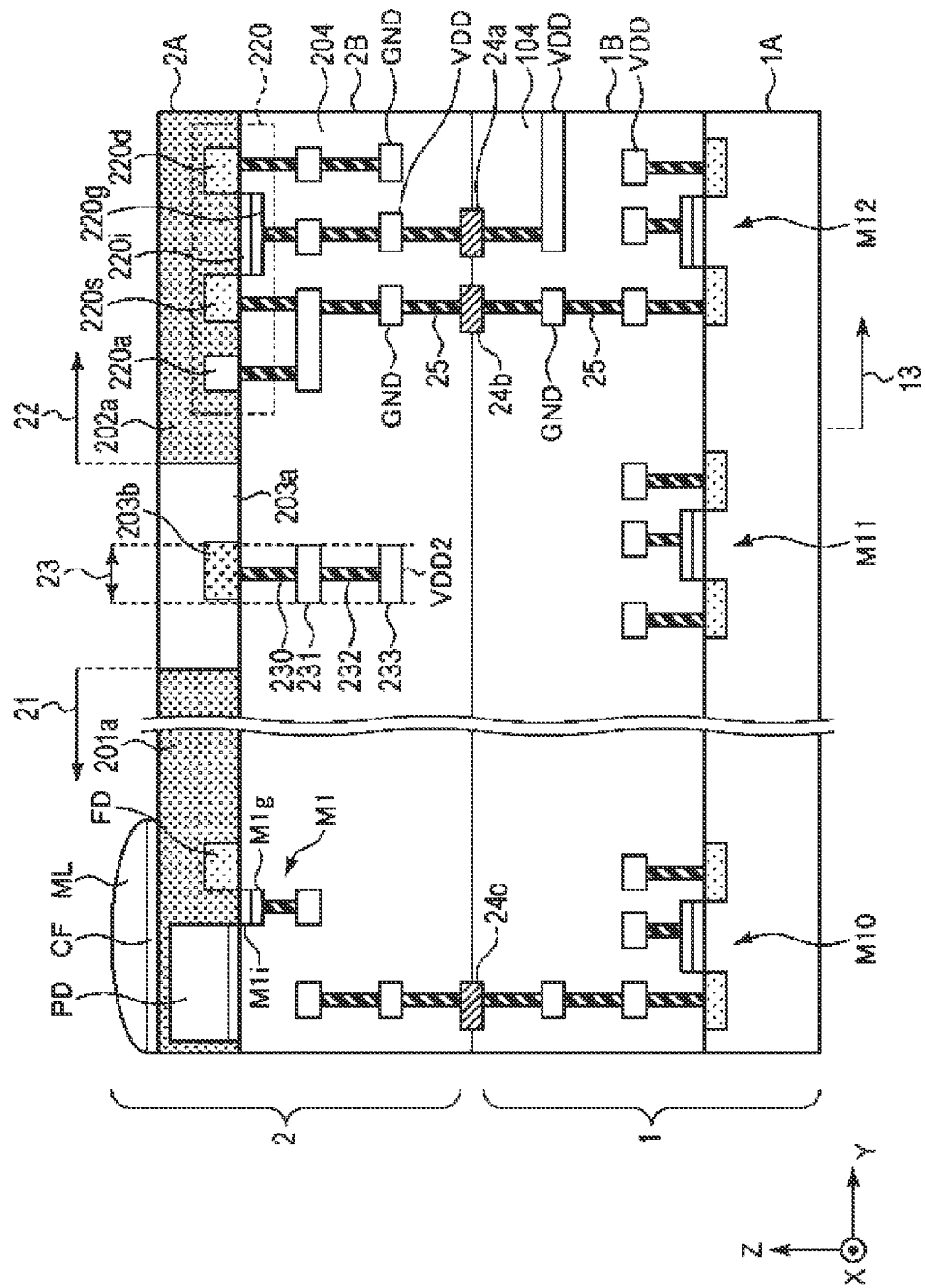
FIG. 3 is a sectional view of the imaging apparatus in the first embodiment of the present invention.

FIG. 3 is a diagram illustrating details of the imaging apparatus of the present embodiment, which is a sectional view taken along a line III-III' of the imaging apparatus of FIG. 1. The first semiconductor component 1 includes a first semiconductor substrate 1A and a first wiring layer region 1B, and the second semiconductor component 2 includes a second semiconductor substrate 2A and a second wiring layer region 2B. The first semiconductor component 1 and the second semiconductor component 2 are stacked such that respective first primary faces of the first semiconductor component 1 and the second semiconductor component 2, that is, the front face of the first wiring layer region 1B and the front face of the second wiring layer region 2B face each other. The second primary face (back face) of the second semiconductor substrate 2A is irradiated with an incident light.

Transistors M10, M11, and M12 are formed in the first semiconductor substrate 1A. For example, the transistor M12 is included in the signal processing unit 13. A P-type well is formed in the first semiconductor substrate 1A, and respective sources and drains of the transistors M10, M11, and M12 are formed as an N-type semiconductor region in the P-type well. A gate electrode is formed interposing a gate insulating film on the P-type well between a source and a drain.

The first wiring layer region 1B is provided on the first semiconductor substrate 1A, and a plurality of wiring layers are formed via the interlayer insulating film 104 made of an organic material or the like. Different wiring layers are connected to each other by a connection portion 25 extending in the Z direction, and the connection portion 25 is further connected to the junction contacts 24a, 24b, and 24c in the upper part of the first wiring layer region 1B. In the signal processing unit 13, the power source wiring VDD is connected to the junction contact 24a, and the ground wiring GND is connected to the junction contact 24b.

The second semiconductor substrate 2A includes P-type wells 201a and 202a in which a P-type impurity is injected and an N-type well 203a in which an N-type impurity is injected. The N-type well 203a is formed between the P-type wells 201a and 202a.

The pixel unit 21 is formed in the P-type well 201a. FIG. 3 illustrates the photoelectric conversion unit PD, the floating diffusion region FD, the transfer transistor M1, a color filter CF, and a micro-lens ML of the pixel unit 21. The photoelectric conversion unit PD includes an N-type region surrounded by the P-type well 201a, and a P-type region is provided above the N-type region (−Z direction). With such a configuration, noise due to charges occurring at an interface can be reduced. The color filter CF and the micro-lens ML are provided on the second primary face (back face) of the second semiconductor substrate 2A. A light entering the back face of the second semiconductor substrate 2A enters the photoelectric conversion unit PD via the micro-lens ML and the color filter CF. In such a way, with a configuration to receive light from the back face of the second semiconductor substrate 2A, a light receiving area is increased, and an imaging apparatus with high sensitivity can be realized.

The floating diffusion region FD includes an N-type region and forms a predetermined capacitor. A gate electrode M1g of the transfer transistor M1 is arranged between the photoelectric conversion unit PD and the floating diffusion region FD and formed on the second semiconductor substrate 2A interposing the gate insulating film M1$i$. The gate electrode M1$g$ is formed of a polysilicon electrode or a metal electrode of Al, Cu, or the like, for example, and the gate insulating film M1$i$ is formed of $SiO_2$ or the like, for example. The source and drain regions of the transfer transistor M1 share the photoelectric conversion unit PD and the floating diffusion region FD. When a voltage is applied to the gate electrode M1$g$, charges accumulated in the photoelectric conversion unit PD are transferred to the floating diffusion region FD. The potential of the floating diffusion region FD changes in accordance with charges and are output via the amplifier transistor M3 and the select transistor M4 (see FIG. 2). A signal output from the pixel unit 21 may be output to the first semiconductor component 1 via the junction contact 24$c$, for example.

The capacitor unit 22 is formed in the P-type well 202$a$ isolated from the pixel unit 21. The capacitor unit 22 includes a single or multiple bypass capacitors 220. The bypass capacitor 220 in the present embodiment has metal-oxide semiconductor (MOS) structure and may be formed of an N-type MOS transistor, for example. The bypass capacitor 220 includes a gate electrode 220$g$, a source region 220$s$, a drain region 220$d$, a substrate bias portion 220$a$, and a gate insulating film 220$i$. An N-type impurity is injected to the source region 220$s$ and the drain region 220$d$. The gate electrode 220$g$ is formed of a polysilicon electrode or a metal electrode of Al, Cu, or the like and arranged between the source region 220$s$ and the drain region 220$d$. The gate electrode 220$g$ interposes the gate insulating film 220$i$ and is formed on the second semiconductor substrate 2A. The gate insulating film 220$i$ is formed of $SiO_2$, SiON, SiN, or the like. When SiON or SiN is used in the gate insulating film 220$i$, a bypass capacitor 220 having a high dielectric constant may be realized.

Further, the substrate bias portion 220$a$ of the N-type region is formed in the P-type well 202$a$. In the bypass capacitor 220, when the power source voltage VDD is applied to the gate electrode 220$g$, and the ground voltage GND is applied to the substrate bias portion 220$a$, the source region 220$s$, and the drain region 220$d$, a channel region is formed between the source region 220$s$ and the drain region 220$d$. The gate electrode 220$g$ forms one electrode (first input node) of the bypass capacitor 220, and the source region 220$s$ and the drain region 220$d$ form the other electrode (second input node) of the bypass capacitor 220.

The substrate bias portion 220$a$, the source region 220$s$, and the drain region 220$d$ are connected to the ground wiring GND in the second wiring layer region 2B, and the ground wiring GND is connected to the junction contact 24$b$ via the connection portion 25. The junction contact 24$b$ is connected to the ground wiring GND of the signal processing unit 13 in the first wiring layer region 1B. Similarly, the gate electrode 220$g$ is connected to the power source wiring VDD in the second wiring layer region 2B, and the power source wiring VDD is connected to the junction contact 24$a$ via the connection portion 25. The junction contact 24$a$ is connected to the power source wiring VDD of the signal processing unit 13 in the first wiring layer region 1B. That is, the bypass capacitor 220 of the second semiconductor component 2 is connected to the signal processing unit 13 of the first semiconductor component 1.

Note that, while FIG. 3 illustrates only the single junction contact 24$a$ and the single junction contact 24$b$, multiple junction contacts 24$a$ or multiple junction contacts 24$b$ may be provided. Thereby, the impedance of the junction contacts 24$a$ and 24$b$, the power source wiring VDD, and the ground wiring GND is reduced, voltage variation of the power source wiring VDD can be effectively suppressed.

Further, while formed of an N-MOS, the bypass capacitor 220 of FIG. 3 may be formed of a P-MOS. That is, when an N-type well is used instead of the P-type well 202$a$ of the capacitor unit 22, the bypass capacitor 220 of a P-MOS can be formed. Further, an N-type well may be formed inside the P-type well 202$a$, and a P-MOS may be further formed inside the N-type well.

Figure 4:
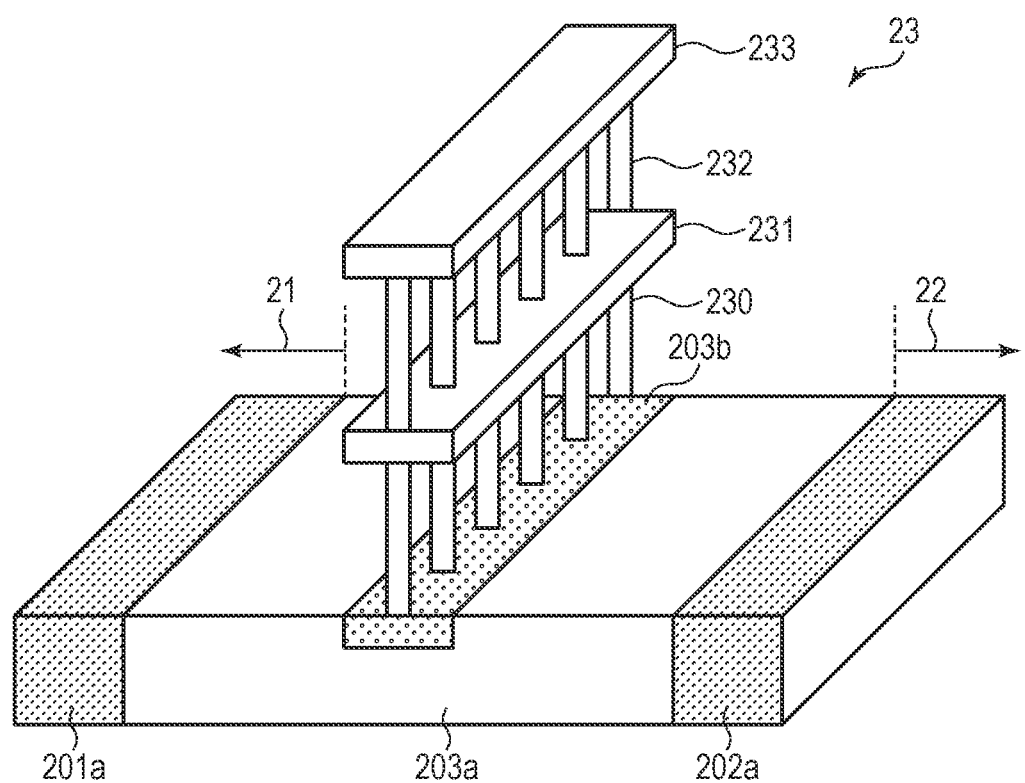
FIG. 4 is a sectional perspective view of a shield portion in the first embodiment of the present invention.

The shield portion 23 is formed in the N-type well 203$a$ between the pixel unit 21 and the capacitor unit 22. A detailed configuration of the shield portion 23 will now be described with reference to FIG. 4 in addition to FIG. 3. FIG. 4 is a perspective sectional view of a shield portion. The shield portion 23 includes a substrate bias portion 203$b$, wiring layers 231 and 233, and connection portions 230 and 232. The substrate bias portion 203$b$ is formed by injecting a high concentration N-type impurity in the surface of the N-type well 203$a$. The substrate bias portion 203$b$ is arranged between the pixel unit 21 and the capacitor unit 22 in X-Y plan view and has a predetermined width (Y direction). The plurality of wiring layers 231 and 233 are formed in the perpendicular direction (−Z direction) to the substrate bias portion 203$b$. The wiring layers 231 and 233 each have a predetermined wiring width (Y direction) as with the substrate bias portion 203$b$. Note that each width in the Y direction of the wiring layers 231 and 233 may be the same as the width of the substrate bias portion 203$b$. The substrate bias portion 203$b$ and the wiring layer 231 are connected to each other by the plurality of connection portions 230 extending in the Z direction. The plurality of connection portions 230 are arranged at regular intervals in the X direction. Similarly, the wiring layer 231 and the wiring layer 233 are connected to a plurality of connection portions 232 extending in the Z direction. The plurality of connection portions 232 are arranged at regular intervals in the X direction along the wiring layers 231 and 233. Note that the interval of the connection portions 232 may be the same as the interval of the connection portions 230. A fixed voltage VDD2 is applied to the wiring layers 231 and 233, and the shield portion 23 has a low impedance. The fixed voltage VDD2 may be the power source voltage VDD or may be a power source voltage specific to the shield portion 23 or the ground voltage GND.

Since the shield portion 23 is provided between the pixel unit 21 and the capacitor unit 22, this can avoid mixture of noise, which may occur in the capacitor unit 22, into the pixel unit 21. Further, the shield portion 23 has a grid shape and extends in the perpendicular direction (−Z direction) of the second wiring layer region 2B. Thus, it is possible to obtain a sufficient shield effect not only in the second semiconductor substrate 2A but also in the second wiring layer region 2B. Note that, to further enhance the shield effect, the number of wiring layers and connection portions forming the shield portion 23 may be increased. Furthermore, the shield portion 23 may be arranged in a plurality of columns.

Figure 5:
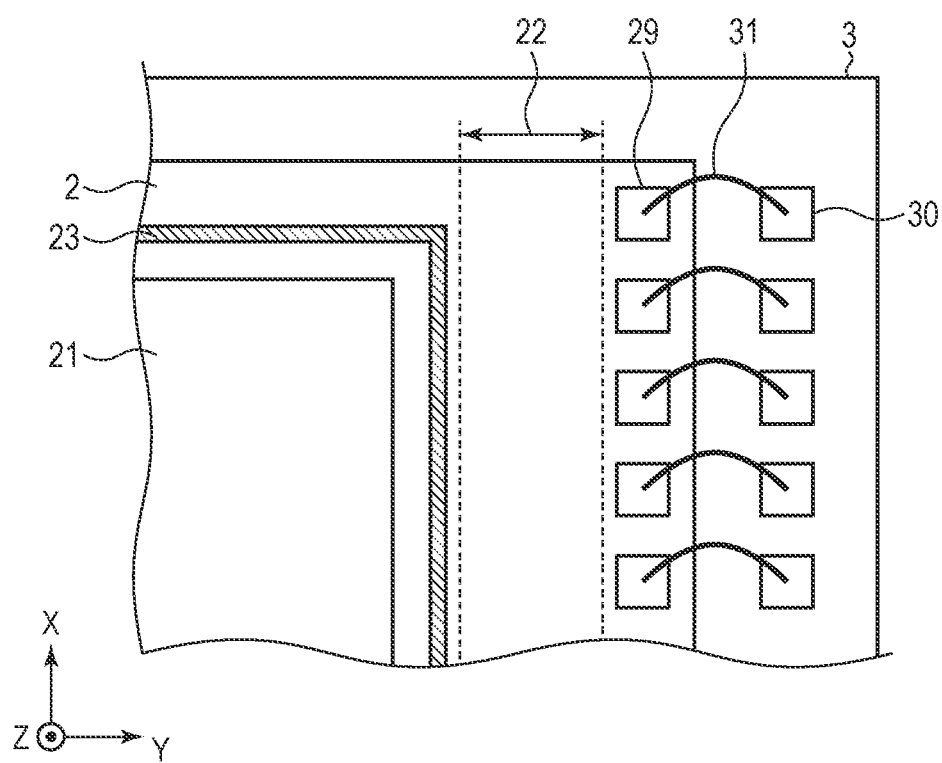
FIG. 5 is a plan view of a part of the imaging apparatus in the first embodiment of the present invention.

FIG. 5 is a plan view of a part of the imaging apparatus of the present embodiment. The first semiconductor component 1 and the second semiconductor component 2 are stacked and placed on a package 3. A plurality of pad electrodes 29 are aligned along the side (edge) of the first semiconductor component 1 and the second semiconductor component 2, and the pad electrodes 29 are connected to an input/output circuit, the power source line, the ground line, or the like of the second semiconductor component 2. A plurality of external pad electrodes 30 are aligned in the package 3. Each pad electrode 29 and each external pad electrode 30 are connected to each other by a bonding wire 31, and each external pad electrode 30 may be connected to a circuit outside the imaging apparatus. In this example, the pad electrodes 29 are arranged in the second wiring layer region 2B of the second semiconductor component 2. Further, the pad electrodes 29 are connected to the first semiconductor component 1 via junction contacts. However, the pad electrodes 29 may be arranged in the first wiring layer region 1B of the first semiconductor component 1. Further, the pad electrodes 29 may be arranged on the opposite side from the first semiconductor component 1 with respect to the second wiring layer region 2B, and the pad electrodes 29 may be connected to the second semiconductor component 2 via through electrodes that penetrate the second semiconductor substrate 2A. Further, the pad electrodes 29 may be arranged on the opposite side from the second semiconductor component 2 with respect to the first wiring layer region 1B, and the pad electrodes 29 may be connected to the first semiconductor component 1 via through electrodes that penetrate the first semiconductor substrate 1A.

The bonding wire 31 is formed of a glossy material such as gold, aluminum, copper, palladium, or the like and is likely to reflect an incident light. When a reflected light at the bonding wire 31 enters the pixel unit 21, image quality deterioration such as ghost may occur. To avoid entry of a reflected light into the pixel unit 21 from the bonding wire 31, the pixel unit 21 is often arranged away from the pad electrodes 29, and a redundant space is often provided between the pixel unit 21 and the pad electrode 29. In the present embodiment, by providing the capacitor unit 22 in the redundant space occurring in the second semiconductor component 2, it is no longer necessary to provide a semiconductor component or the like specific to the bypass capacitor 220, and an increase in the manufacturing cost can be suppressed. In particular, when the pad electrodes 29 are arranged along four sides of the second semiconductor component 2, the redundant space may occur along the four sides. By providing the capacitor unit 22 along four side of the capacitor unit 22, it is possible to further increase the capacitance of the bypass capacitor 220 and effectively suppress the variation of the power source voltage VDD. In such a way, the size, the number, and the shape of the capacitor unit 22 may be determined in accordance with the redundant space of the second semiconductor component 2. For example, a small capacitor unit 22 may be arranged for a portion where the redundant space is small, and a large capacitor unit 22 may be arranged for a portion where the redundant space is large.

In the imaging apparatus configured as described above, by using a capacitor unit as a bypass capacitor, it is possible to effectively suppress variation in the power source voltage when a large current momentarily flows in the signal processing unit. When the signal processing unit is formed of a digital circuit, a large current may momentarily flow as a switching current, and the power source voltage may decrease. Such variation of the power source voltage may affect another circuit as noise. However, when a bypass capacitor is provided between the power source line and the ground line, since a current can be supplied from the bypass capacitor to the power source line, variation of the power source voltage can be suppressed.

As described above, in the present embodiment, the capacitor unit used for the first semiconductor component is provided in the second semiconductor component. Thus, it is no longer necessary to provide a semiconductor component specific to the capacitor unit, and it is possible to reduce the manufacturing cost. In particular, when the semiconductor apparatus is an imaging apparatus, it is possible to effectively arrange the capacitor unit outside a pixel unit by using a redundant space occurring around the pixel unit.

Note that, while the capacitor unit in the present embodiment may be used for various uses such as a coupling capacitor without being limited to a bypass capacitor, the present embodiment is particularly preferable for a bypass capacitor. It is desirable that the bypass capacitor have a large capacitance as much as possible, and conventionally, it is necessary to provide a semiconductor component specific to a bypass capacitor. According to the present embodiment, by using a redundant space of the second semiconductor component to provide a bypass capacitor used for a circuit of the first semiconductor component, it is no longer necessary to provide a semiconductor component specific to the bypass capacitor.

Further, in the present embodiment, since a bypass capacitor is provided inside a semiconductor component, the wiring length between the bypass capacitor and the signal processing unit can be reduced compared to a case where a bypass capacitor is provided outside the semiconductor component. Thus, the impedance of wirings is also reduced, and variation of the power source voltage can be more effectively suppressed. If a bypass capacitor is provided outside the semiconductor component, the impedance at a high frequency increases due to the inductance of a bonding wire and an external wiring, and the effect of the bypass capacitor will be offset. The configuration in which the bypass capacitor is provided inside a semiconductor component is particularly effective in suppressing a high frequency noise in the power source voltage.

Furthermore, in the present embodiment, the bypass capacitor is connected to a signal processing unit via a junction contact. Since the area of the junction contact is smaller than the area of the bonding pad, a plurality of junction contacts can be provided inside the semiconductor component. As the number of junction contacts increases, the impedance of the power source wiring between the bypass capacitor and the signal processing unit decreases. Thus, the number of wirings of the bypass capacitor and the number of junction contacts can be increased compared to a case where a bypass capacitor is provided outside a semiconductor component, and variation of the power source voltage can be further effectively suppressed.

Note that, although the example in which the bypass capacitor is connected to the signal processing unit has been described in the above embodiment, the circuit unit to which the bypass capacitor is connected is not limited to the signal processing unit. The bypass capacitor can be connected also in a circuit in which variation of the power source voltage in a high frequency band may occur, for example, an analog-to-digital converter circuit, a parallel-to-serial converter circuit used for high speed serial data transmission, a transmitter circuit, a memory circuit, or the like. Further, the present embodiment may be applied to an analog circuit in which a large current may momentarily flow without being limited to a digital circuit.

Second Embodiment

Figure 6:
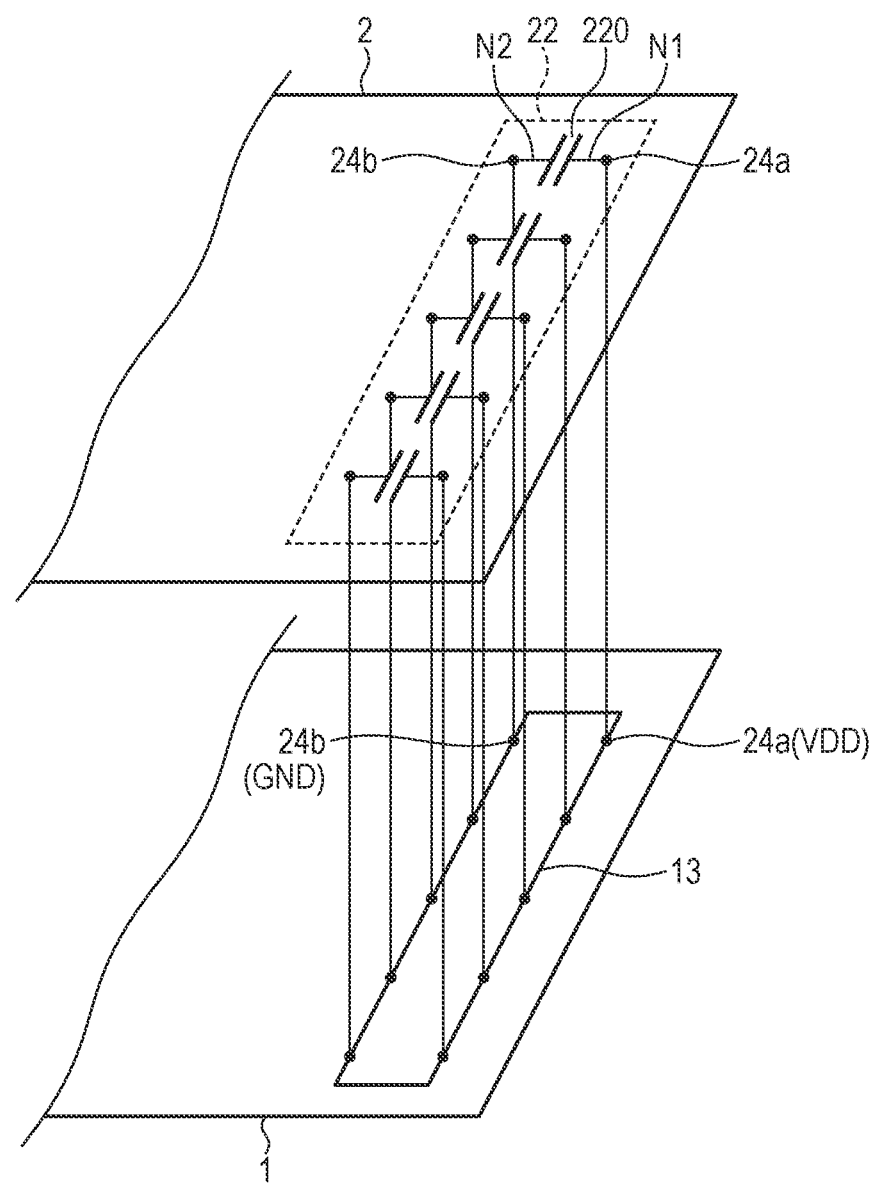
FIG. 6 is a schematic diagram of an imaging apparatus in a second embodiment of the present invention.

FIG. 6 is a schematic diagram of an imaging apparatus of the present embodiment. The number of bypass capacitors 220 included in the capacitor unit 22 may be plural without being limited to one. The imaging apparatus of the present embodiment will be described below mainly for a configuration different from the first embodiment.

In FIG. 6, the capacitor unit 22 includes the plurality of bypass capacitors 220, and each of the bypass capacitors 220 is connected to the signal processing unit 13 of the first semiconductor component 1 via the junction contacts 24a and 24b. That is, the first input node N1 of the bypass capacitor 220 is connected to the power source wiring VDD of the signal processing unit 13 via the junction contact 24a, and the second input node N2 of the bypass capacitor 220 is connected to the ground wiring GND of the signal processing unit 13 via the junction contact 24b.

In the present embodiment, by using a plurality of bypass capacitors connected in parallel, it is possible to increase the capacitance. For example, when it is difficult to increase the capacitance of a single bypass capacitor or the like, bypass capacitors having a large capacitance as a whole can be realized by connecting a plurality of bypass capacitors in parallel. That is, in the plurality of bypass capacitances, a plurality of first input nodes N1 may be connected to each other, and a plurality of second input nodes N2 may be connected to each other.

Third Embodiment

Figure 7:
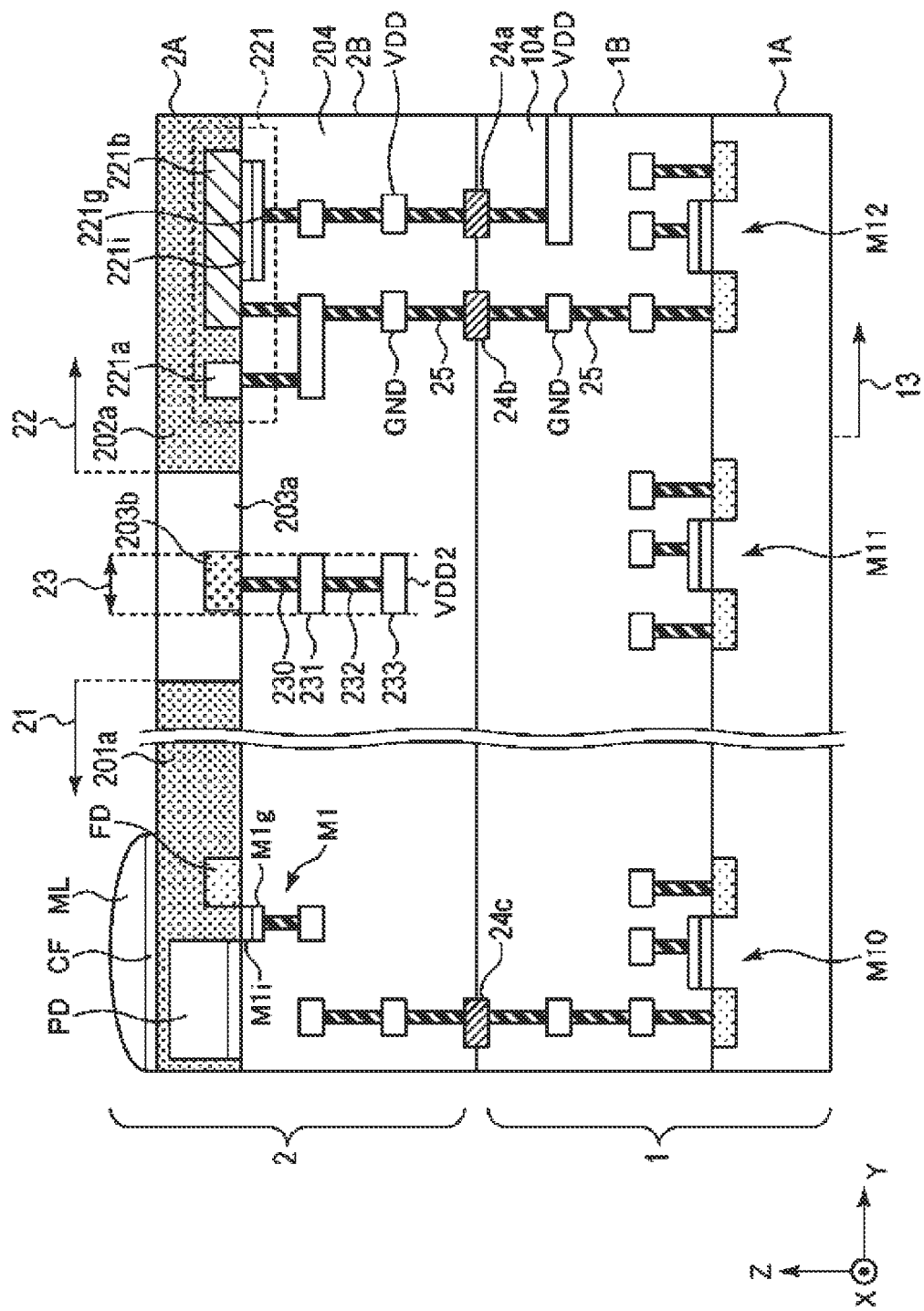
FIG. 7 is a sectional view of an imaging apparatus in a third embodiment of the present invention.

FIG. 7 is a sectional view of an imaging apparatus of the present embodiment, which is a sectional view taken along the line III-III' of the imaging apparatus of FIG. 1. The imaging apparatus of the present embodiment is different in structure of the capacitor unit from the first embodiment. The configuration different from the first embodiment will be mainly described below.

In FIG. 7, a bypass capacitor 221 is formed in the P-type well 202a of the second semiconductor substrate 2A and includes a substrate bias portion 221a, a semiconductor region 221b, a gate electrode 221g, and a gate insulating film 221i. The semiconductor region 221b is formed by injecting a high concentration N-type impurity in the P-type well 202a. The gate electrode 221g is formed on the semiconductor region 221b via the gate insulating film 221i. The gate electrode 221g is formed of a polysilicon electrode or a metal electrode of Al, Cu, or the like, for example, and the gate insulating film 221i is formed of $SiO_2$, SiON, SiN, or the like, for example. The substrate bias portion 221a of the N-type region is formed in the P-type well 202a.

The substrate bias portion 221a and the semiconductor region 221b are connected to the ground wiring GND in the second wiring layer region 2B, and the ground wiring GND is connected to the junction contact 24b via the connection portion 25. The junction contact 24b is connected to the ground wiring GND of the signal processing unit 13 in the first wiring layer region 1B. Similarly, the gate electrode 221g is connected to the power source wiring VDD of the second wiring layer region 2B, and the power source wiring VDD is connected to the junction contact 24a via the connection portion 25. The junction contact 24a is connected to the power source wiring VDD of the signal processing unit 13 in the first wiring layer region 1B. That is, the bypass capacitor 221 in the second semiconductor component 2 is connected to the signal processing unit 13 of the first semiconductor component 1.

Also in the present embodiment, by providing the capacitor unit used for the first semiconductor component in the second semiconductor component, it is no longer necessary to provide a semiconductor component specific to the capacitor unit, and it is possible to reduce the manufacturing cost.

Fourth Embodiment

Figure 8:
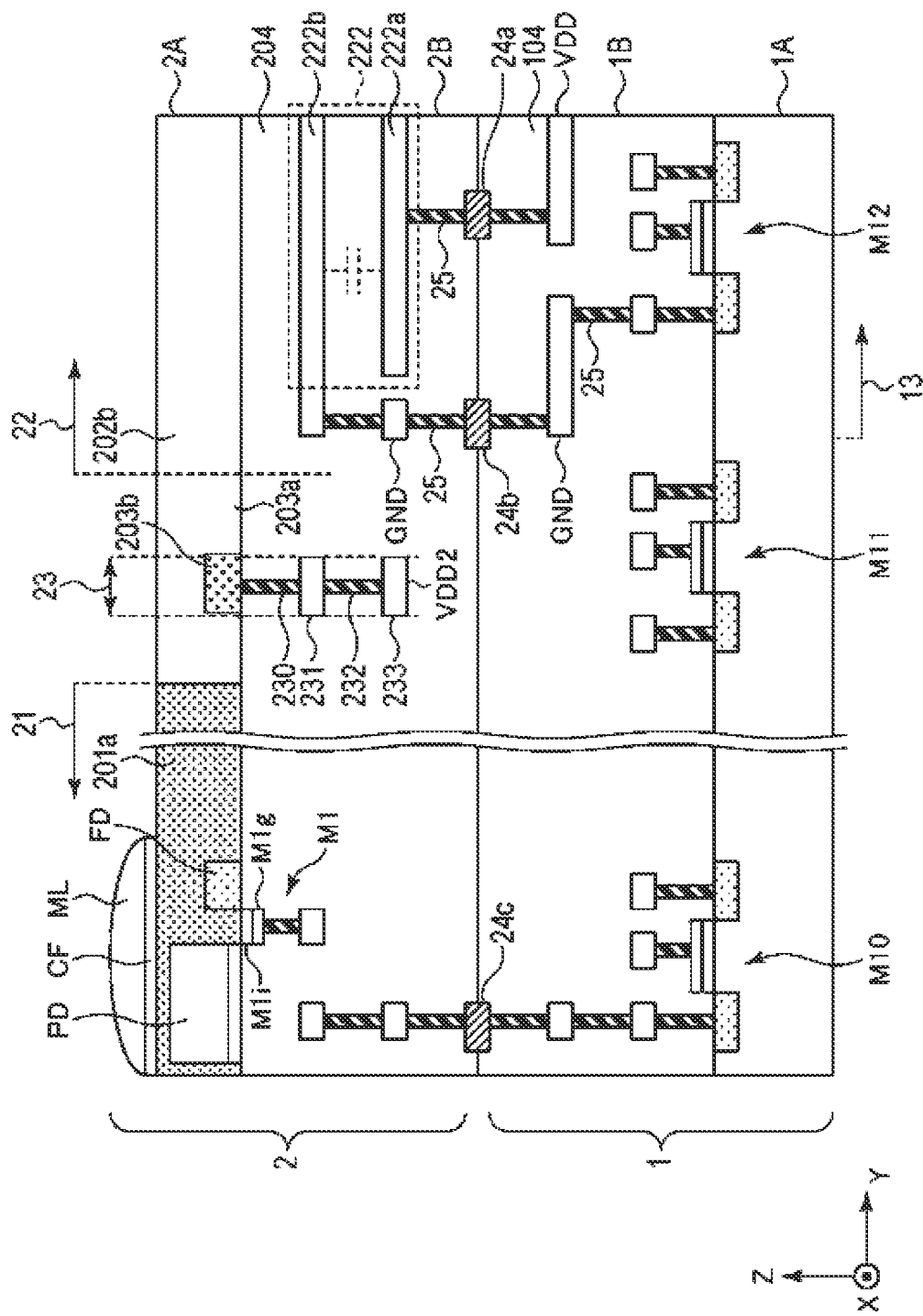
FIG. 8 is a sectional view of an imaging apparatus in a fourth embodiment of the present invention.

FIG. 8 is a sectional view of an imaging apparatus of the present embodiment, which is a sectional view taken along the line III-III' of the imaging apparatus of FIG. 1. The imaging apparatus of the present embodiment includes a capacitor unit having metal-insulator-metal (MIM) structure. The configuration different from the first embodiment will be mainly described below.

In FIG. 8, the capacitor unit 22 includes a single or multiple bypass capacitors 222, and each bypass capacitor 222 is formed of two layers of a metal wirings 222a and 222b. The metal wirings 222a and 222b face each other in the Z direction and are arranged with a predetermined gap. An interlayer insulating film 204 is interposed between the metal wirings 222a and 222b, and the interlayer insulating film 204 functions as a dielectric member. The metal wiring 222a is connected to the junction contact 24a via the connection portion 25 in the second wiring layer region 2B. The junction contact 24a is connected to the power source wiring VDD of the signal processing unit 13 in the first wiring layer region 1B. Similarly, the metal wiring 222b is connected to the ground wring GND in the second wiring layer region 2B, and the ground wiring GND is connected to the junction contact 24b via the connection portion 25. The junction contact 24b is connected to the ground wiring GND of the signal processing unit 13 in the first wiring layer region 1B. That is, the bypass capacitor 222 in the second semiconductor component 2 is connected to the signal processing unit 13 of the first semiconductor component 1.

According to the present embodiment, the bypass capacitor 222 can be formed by using a metal wiring in the second semiconductor component. Note that the number of layers of the metal wirings forming the bypass capacitor 222 is not limited to two but may be three or more. By increasing the number of layers of the metal wirings, it is possible to form the bypass capacitor 222 having a large capacitance.

Note that the capacitor unit 22 in the present embodiment is arranged on the second wiring layer region 2B instead of the second semiconductor substrate 2A. Thus, the region 202b corresponding to the capacitor unit 22 in the second semiconductor substrate 2A is not necessarily required to be a P-type well but may be an N-type well. Further, a P-type well may be formed in the region 202b, and the capacitor unit 22 of the first to third embodiments may be further provided in addition to the capacitor unit 22 of the present embodiment. That is, the capacitor unit 22 may be formed in the second semiconductor substrate 2A and the second wiring layer region 2B, respectively, and the capacitance of the bypass capacitors can be increased.

Fifth Embodiment

Figure 9:
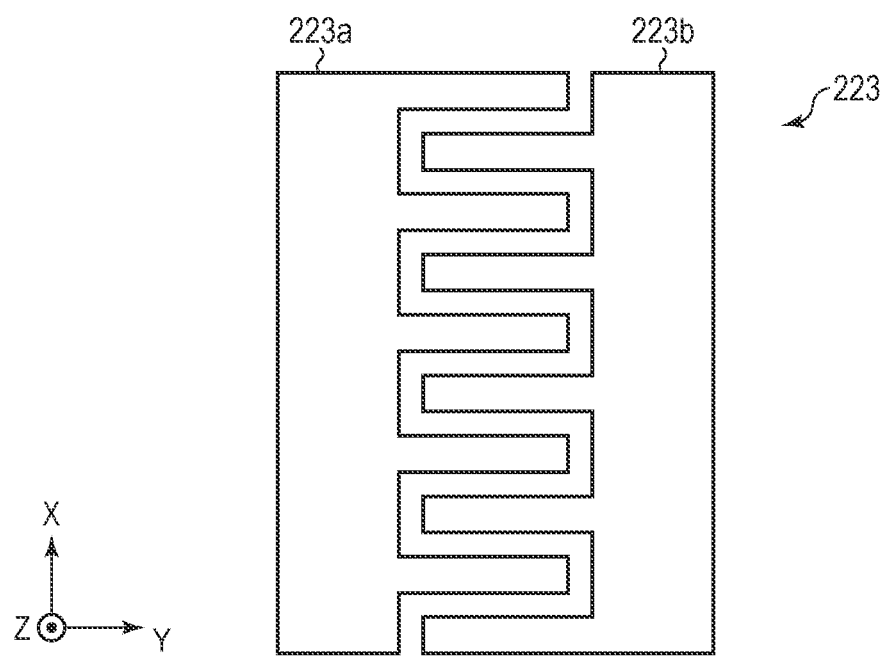
FIG. 9 is a diagram illustrating an imaging apparatus in a fifth embodiment of the present invention.

FIG. 9 is a diagram illustrating is a diagram illustrating an imaging apparatus of the present embodiment and represents a modified example of the capacitor unit of the fourth embodiment. Although the capacitor unit of the fourth embodiment is formed of two different layers of metal wirings, the capacitor unit of the present embodiment is formed of a single layer of metal wirings. The configuration different from the fourth embodiment will be mainly described below.

In FIG. 9, a bypass capacitor 223 has metal wirings 223a and 223b formed in the same layer, and metal wirings 223a and 223b are arranged adjacent to each other with a predetermined gap in plan view. In the metal wirings 223a and 223b, concave portions and convex portions are formed on respective facing sides. The convex portion of the metal wiring 223a is located inside the concave portion of the metal wiring 223b, and the convex portion of the metal wiring 223b is located inside the concave portion of the metal wiring 223a. With such a configuration, the total length of the sides where the metal wirings 223a and 223b face each other increases, and the capacitance of the metal wirings 223a and 223b increases. The metal wirings 223a and 223b are connected to the signal processing unit 13 of the first semiconductor component 1 via the junction contacts 24a and 24b (not illustrated).

As described above, the capacitor unit can be formed by using the same layer of the metal wirings in the second semiconductor component. Also in the present embodiment, since it is not necessary to provide a semiconductor component specific to the capacitor unit, and it is possible to reduce the manufacturing cost.

Sixth Embodiment

Figure 10:
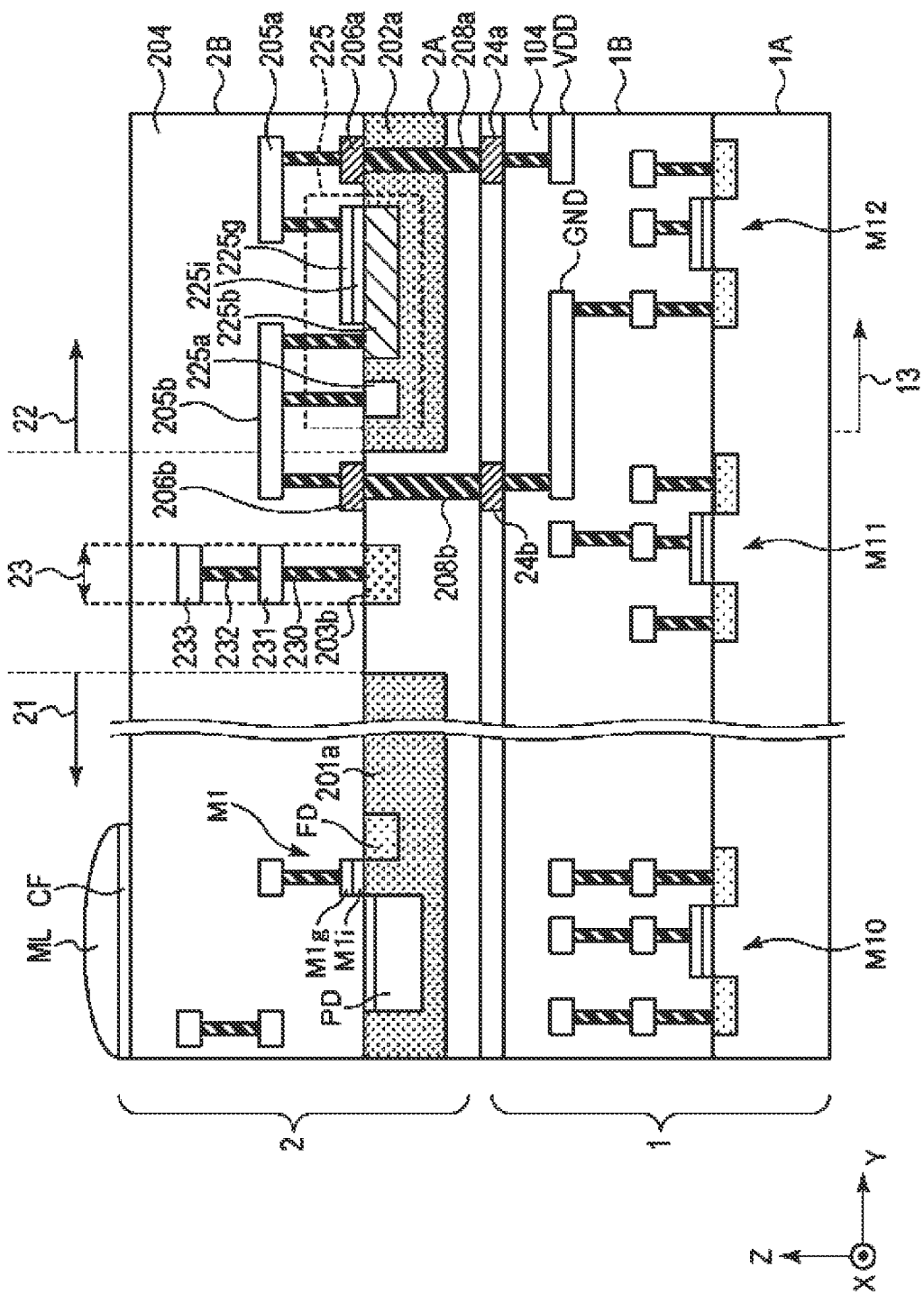
FIG. 10 is a sectional view of an imaging apparatus in a sixth embodiment of the present invention.

FIG. 10 is a sectional view of an imaging apparatus of the present embodiment, which is a sectional view taken along the line of III-III' the imaging apparatus of FIG. 1. In the present embodiment, the front face and the back face of the second semiconductor component 2 are arranged in the opposite manner to those in the first to fifth embodiments, and a front side irradiation imaging apparatus is thus configured. The configuration different from the first to fifth embodiments will be mainly described below.

In FIG. 10, the second primary face (back face) of the second semiconductor substrate 2A is attached to the first wiring layer region 1B, and the first primary face (front face) of the second wiring layer region 2B is irradiated with an incident light. In the first semiconductor component 1, the analog-to-digital conversion unit 11, the memory unit 12, the signal processing unit 13, and the vertical scanning unit 14 are provided in substantially the same manner as the first to fifth embodiments.

The second semiconductor substrate 2A includes the P-type wells 201a and 202a in which a P-type impurity is injected. The pixel unit 21 is formed in the P-type well 201a, and FIG. 10 illustrates the photoelectric conversion unit PD, the floating diffusion region FD, the transfer transistor M1, the color filter CF, and the micro-lens ML. The color filter CF and the micro-lens ML are arranged on the front face of the second wiring layer region 2B above the photoelectric conversion unit PD.

The capacitor unit 22 is formed in the P-type well 202a and includes a bypass capacitor 225. The bypass capacitor 225 is configured in the same manner as the bypass capacitor 221 of the third embodiment and includes a substrate bias portion 225a, a semiconductor region 225b, a gate electrode 225g, and a gate insulating film 225i. The semiconductor region 225b is formed by injecting a high concentration N-type impurity in the P-type well 202a. The gate electrode 225g is formed on the semiconductor region 225b via the gate insulating film 225i. The gate electrode 225g is formed of a polysilicon electrode or a metal electrode of Al, Cu, or the like, for example, and the gate insulating film 225i is formed of $SiO_2$, SiON, SiN, or the like, for example. The substrate bias portion 225a may be formed by injecting the N-type region in the P-type well 202a.

The gate electrode 225g is connected to the metal wiring 205a via a connection portion in the second wiring layer region 2B. The metal wiring 205a is further connected to the electrode 206a via a connection portion, and the electrode 206a is connected to the junction contact 24a via a through electrode 208a of the second semiconductor substrate 2A. The junction contact 24a is connected to the power source wiring VDD of the signal processing unit 13 in the first semiconductor substrate 1A. Further, the substrate bias portion 225a and the semiconductor region 225b are connected to the metal wiring 205b via a connection portion in the second wiring layer region 2B. The metal wiring 205b is further connected to the electrode 206b via a connection portion, and the electrode 206b is connected to the junction contact 24b via a through electrode 208b of the second semiconductor substrate 2A. The junction contact 24b is connected to the ground wiring GND of the signal processing unit 13 of the first semiconductor substrate 1A. The shield portion 23 is provided between the pixel unit 21 and the capacitor unit 22 as with the first to fifth embodiments.

Also in the present embodiment, since the capacitor unit used for the first semiconductor component is provided in the second semiconductor component, it is no longer necessary to provide a semiconductor component specific to the capacitor unit, and it is possible to reduce the manufacturing cost.

Seventh Embodiment

An imaging system according to a seventh embodiment of the present invention will be described with reference to FIG. 11. FIG. 11 is a block diagram illustrating a configuration example of the imaging system according to the present embodiment.

Each imaging apparatus in the embodiments described above is applicable to various imaging systems. The imaging system may be a digital still camera, a digital camcorder, a camera head, a copy machine, a fax machine, a mobile phone, an on-vehicle camera, an observation satellite, a surveillance camera, or the like. FIG. 11 illustrates block diagram of a digital still camera as an example of an imaging system.

An imaging system 7 illustrated in FIG. 11 includes a barrier 706, a lens 702, an aperture 704, an imaging apparatus 70, a signal processing unit 708, a timing generation unit 720, a general control/operation unit 718, a memory unit 710, a storage medium control I/F unit 716, a storage medium 714, and an external I/F unit 712. The barrier 706 protects the lens 702, and the lens 702 captures an optical image of an object onto the imaging apparatus 70. The aperture 704 changes the amount of light that has passed through the lens 702. The imaging apparatus 70 is configured as with the embodiments described above and converts an optical image captured by the lens 702 into image data. Herein, an analog-to-digital (AD) conversion unit is formed on a semiconductor substrate of the imaging apparatus 70. The signal processing unit 708 performs various correction and data compression on imaging data output from the imaging apparatus 70.

The timing generation unit 720 outputs various timing signals to the imaging apparatus 70 and the signal processing unit 708. The general control/operation unit 718 controls the entire digital still camera, and the memory unit 710 temporarily stores image data. The storage medium control I/F unit 716 is an interface used for storage or reading of image data on the storage medium 714, and the storage medium 714 is a removable storage medium such as a semiconductor memory used for storage or reading of imaging data. The external I/F unit 712 is an interface used for communicating with an external computer or the like. A timing signal or the like may be input from the outside of the imaging system, and the imaging system may be any imaging system having at least the imaging apparatus 70 and the signal processing unit 708 that processes an imaging signal output from the imaging apparatus 70.

While the imaging apparatus 70 and the AD conversion unit are provided on the separate semiconductor substrates in the present embodiment, the imaging apparatus 70 and the AD conversion unit may be formed on the same semiconductor substrate. Further, the imaging apparatus 70 and the signal processing unit 708 may be formed on the same semiconductor substrate.

Further, each pixel may include a first photoelectric conversion unit and a second photoelectric conversion unit. The signal processing unit 708 may be configured to process a pixel signal based on charges generated by the first photoelectric conversion unit and a pixel signal based on charges generated by the second photoelectric conversion unit and acquire distance information from the imaging apparatus 70 to an object.

Eighth Embodiment

Figure 12A:
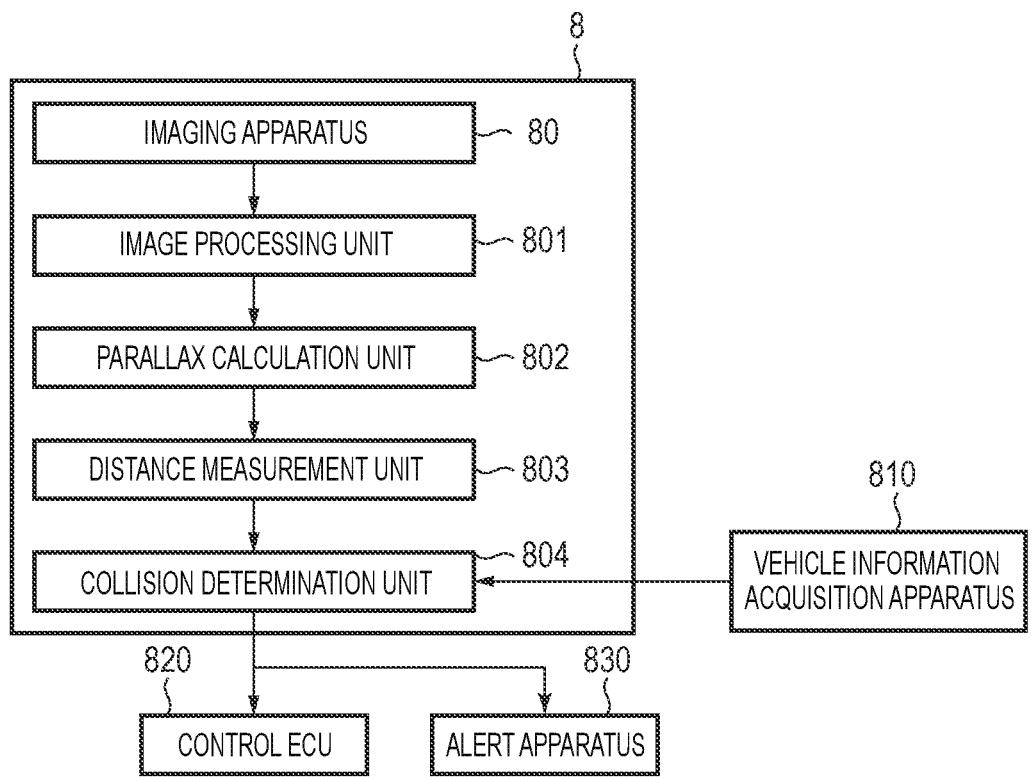
FIG. 12A and FIG. 12B are diagrams illustrating a configuration example of an imaging system and a moving unit according to an eighth embodiment of the present invention.
Figure 12B:
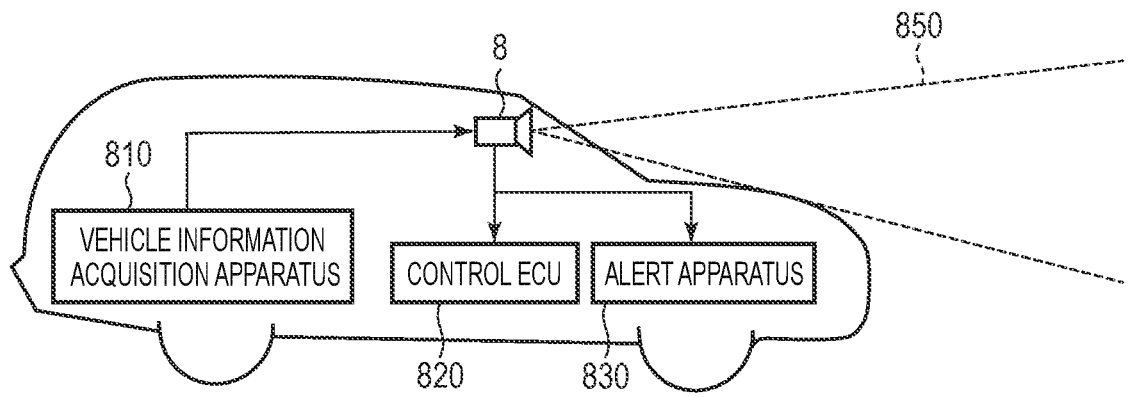

FIG. 12A and FIG. 12B are block diagrams of an imaging system related to an on-vehicle camera in the present embodiment. An imaging system 8 has an imaging apparatus 80 of any of the embodiments described above. The imaging system 8 has an image processing unit 801 that performs image processing on a plurality of image data acquired by the imaging apparatus 80 and a parallax calculation unit 802 that calculates a parallax (a phase difference of parallax images) from the plurality of image data acquired by the imaging system 8. Further, the imaging system 8 has a distance measurement unit 803 that calculates a distance to the object based on the calculated parallax and a collision determination unit 804 that determines whether or not there is a collision possibility based on the calculated distance. Here, the parallax calculation unit 802 and the distance measurement unit 803 are an example of a distance information acquisition apparatus that acquires distance information on the distance to the object. That is, the distance information is information on a parallax, a defocus amount, a distance to an object, or the like. The collision determination unit 804 may use any of the distance information to determine the collision possibility. The distance information acquisition apparatus may be implemented by dedicatedly designed hardware or may be implemented by a software module. Further, the distance information acquisition apparatus may be implemented by a field programmable gate array (FPGA) or an application specific integrated circuit (ASIC) or may be implemented by a combination thereof.

The imaging system 8 is connected to the vehicle information acquisition apparatus 810 and can acquire vehicle information such as a vehicle speed, a yaw rate, a steering angle, or the like. Further, the imaging system 8 is connected to a control ECU 820, which is a control apparatus that outputs a control signal for causing a vehicle to generate braking force based on a determination result by the collision determination unit 804. Further, the imaging system 8 is also connected to an alert apparatus 830 that issues an alert to the driver based on a determination result by the collision determination unit 804. For example, when the collision probability is high as the determination result of the collision determination unit 804, the control ECU 820 performs vehicle control to avoid a collision or reduce damage by applying a brake, pushing back an accelerator, suppressing engine power, or the like. The alert apparatus 830 alerts a user by sounding an alert such as a sound, displaying alert information on a display of a car navigation system or the like, providing vibration to a seat belt or a steering wheel, or the like. The imaging system 8 functions as a control unit that controls the operation of controlling a vehicle as described above.

In the present embodiment, an area around a vehicle, for example, a front area or a rear area is captured by using the imaging system 8. FIG. 12B illustrates the imaging system when a front area of a vehicle (a capturing area 850) is captured. The vehicle information acquisition apparatus 810 as an imaging control unit instructs the imaging system 8 or the imaging apparatus 80 to perform the operation described in the above first to seventh embodiments. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as an automobile and can be applied to a moving unit (moving equipment) such as a ship, an airplane, a satellite, an industrial robot and a consumer use robot, or the like, for example. In addition, the imaging system can be widely applied to an apparatus which utilizes object recognition or biometric authentication, such as an intelligent transportation system (ITS), a surveillance system, or the like without being limited to moving units.

Ninth Embodiment

Subsequently, a semiconductor apparatus in the present embodiment will be described. The semiconductor apparatus in the present embodiment may also be applied to a voltage generation circuit that generates a reference voltage such as a constant voltage and a voltage that changes with time other than the power source voltage. A circuit forming the analog-to-digital conversion unit 11 illustrated in FIG. 2 will be described below as an example of the first circuit unit arranged in the first semiconductor component 1.

Figure 13:
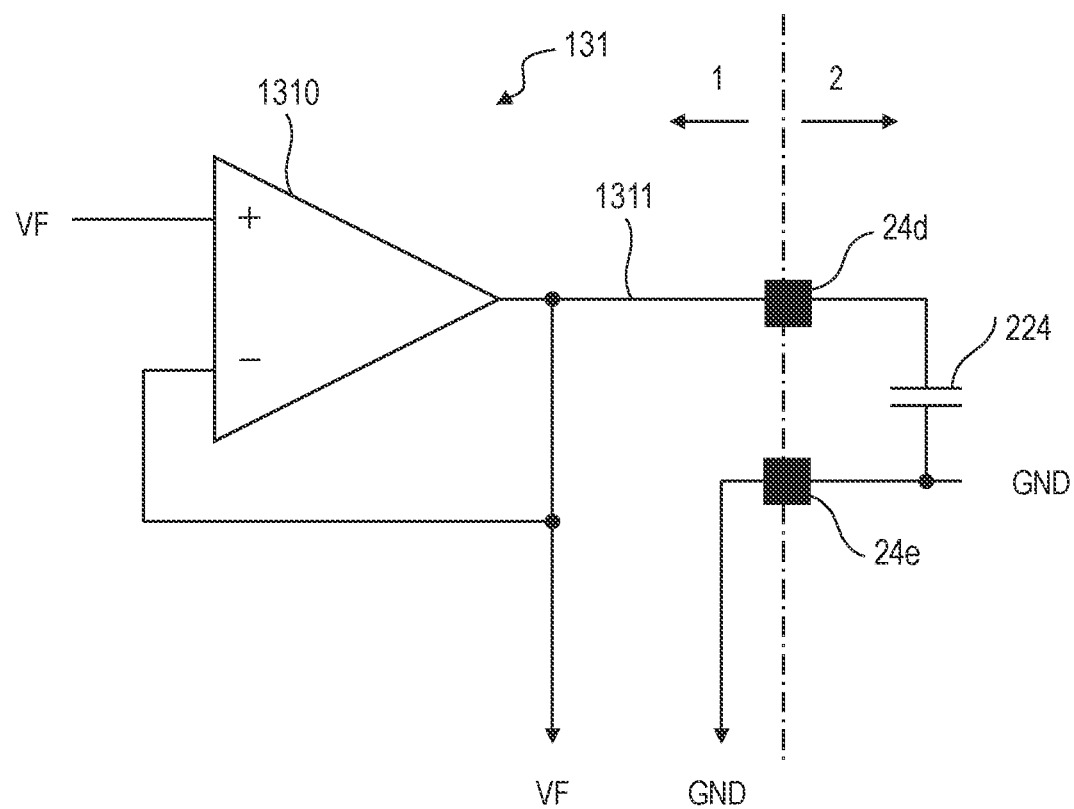
FIG. 13 is a schematic diagram of a reference voltage circuit in a ninth embodiment of the present invention.

FIG. 13 is a schematic diagram of a reference voltage circuit of the present embodiment. The reference voltage circuit 131 is used for a column amplifier on the pre-stage of the analog-to-digital conversion unit 11, for example. The reference voltage circuit 131 includes a differential amplifier 1310 provided in the first semiconductor component 1 and a bypass capacitor (capacitor unit) 224 provided in the second semiconductor component 2. The inverting input terminal and the output terminal of the differential amplifier 1310 are connected to each other, which functions as a voltage follower circuit. The differential amplifier 1310 outputs a reference voltage VF equal to a voltage applied to the non-inverting input terminal to a reference voltage line 1311. The reference voltage line 1311 is connected to one electrode (first input node) of the bypass capacitor 224 via a junction contact 24d. The other electrode (second input node) of the bypass capacitor 224 is connected to the ground wiring GND of the second semiconductor component 2 and connected to the ground wiring GND of the first semiconductor component 1 via a junction contact 24e. Since the bypass capacitor 224 is provided between the reference voltage line 1311 and the ground wiring GND, the impedance of the reference voltage line 1311 and the ground wiring GND is reduced, and variation of the reference voltage VF is suppressed. Since the reference voltage circuit 131 is required to supply only a small current, it is sufficient to provide the bypass capacitor 224 having a relatively small capacitance in the second semiconductor component 2. Since it is not necessary to provide a bypass capacitor having a large capacitance outside the chip, manufacturing cost can be reduced, and the overall apparatus can be formed in a small size.

Figure 14:
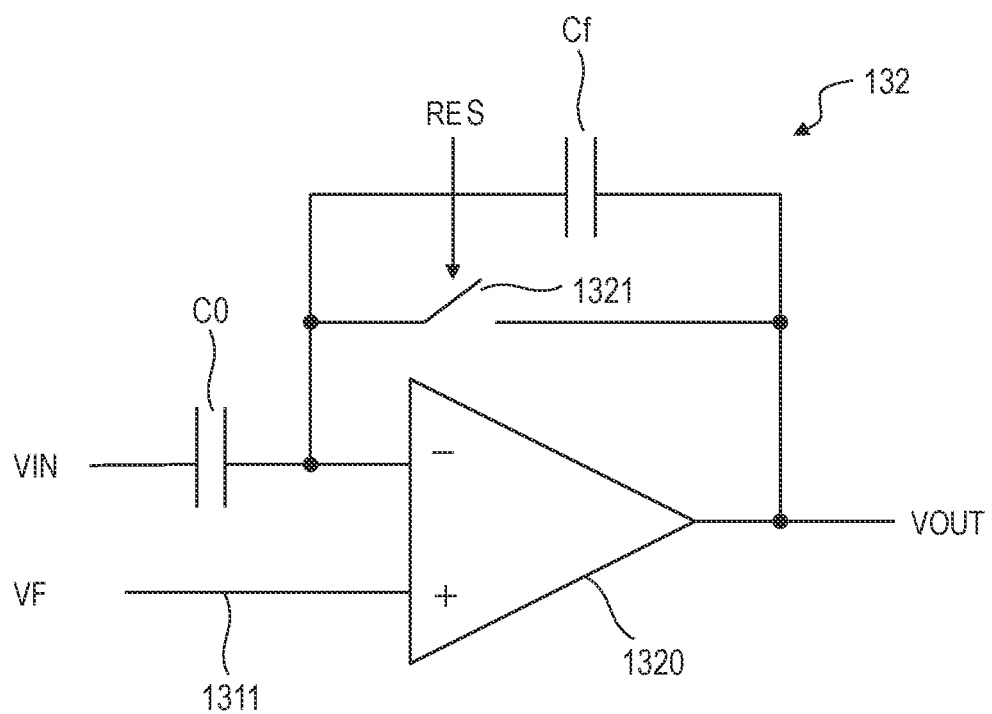
FIG. 14 is a schematic diagram of an inverting amplifier circuit in the ninth embodiment of the present invention.

FIG. 14 is a schematic diagram of an inverting amplifier circuit of the present embodiment. For example, an inverting amplifier circuit 132 is provided for each signal line 211 illustrated in FIG. 2 to amplify a signal of the pixel 210 on each column. A differential amplifier 1320, an input capacitor C0, a feedback capacitor Cf, and a switch 1321 are provided. The reference voltage line 1311 illustrated in FIG. 13 is connected to the non-inverting input terminal of the differential amplifier 1320, and the reference voltage VF is applied to the non-inverting input terminal. A signal VIN is input to the inverting input terminal of the differential amplifier 1320 via the input capacitor C0. The feedback capacitor Cf and the switch 1321 are connected between the inverting input terminal and the output terminal of the differential amplifier 1320. The switch 1321 is formed of a transistor and turned on or off in accordance with a control signal RES applied to the gate. The differential amplifier 1320 amplifies the signal VIN at a gain in accordance with the input capacitor C0, the feedback capacitor Cf, and the switch 1321 and outputs a signal VOUT.

Figure 15:
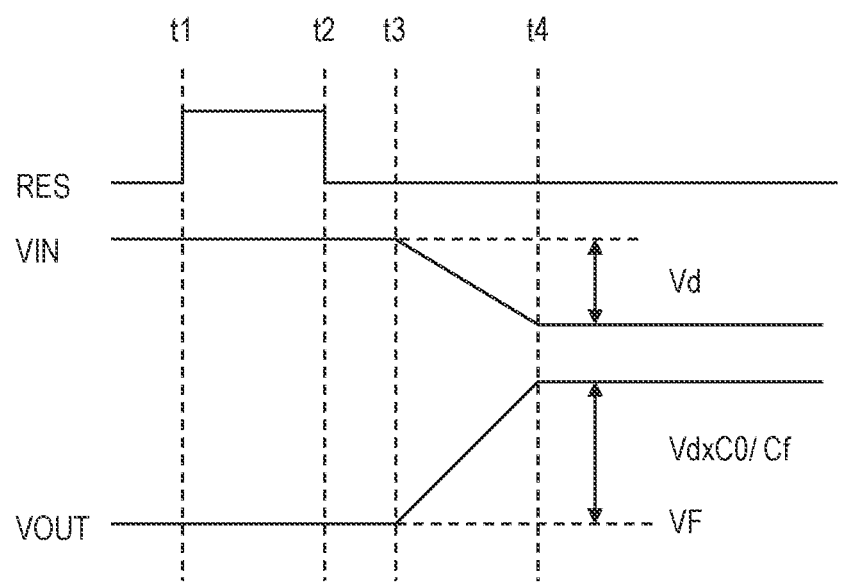
FIG. 15 is a timing chart illustrating an operation of an inverting amplifier circuit in the ninth embodiment of the present invention.

FIG. 15 is a timing chart illustrating the operation of the inverting amplifier circuit of the present embodiment. At time t1, once the control signal RES is controlled to the high level, the switch 1321 is turned on, the output terminal and the inverting input terminal of the differential amplifier 1320 are short-circuited, and the differential amplifier 1320 operates as a voltage follower. Further, the non-inverting input terminal and the inverting input terminal are virtually short-circuited, and the voltage of the inverting input terminal is equal to the reference voltage VF of the non-inverting input terminal. Thus, the voltage of the signal VOUT of the differential amplifier 1320 becomes the reference voltage VF. At time t2, when the control signal RES is controlled to the low level and the switch 1321 is turned off, the amplification factor of the differential amplifier 1320 becomes C0/Cf. During time t3 to t4, when the voltage of the input signal VIN decreases by Vd, the voltage of the output signal VOUT increases by Vd×C0/Cf. The output signal VOUT from the inverting amplifier circuit 132 is converted into digital data by the analog-to-digital conversion unit 11 illustrated in FIG. 2, for example.

Figure 16:
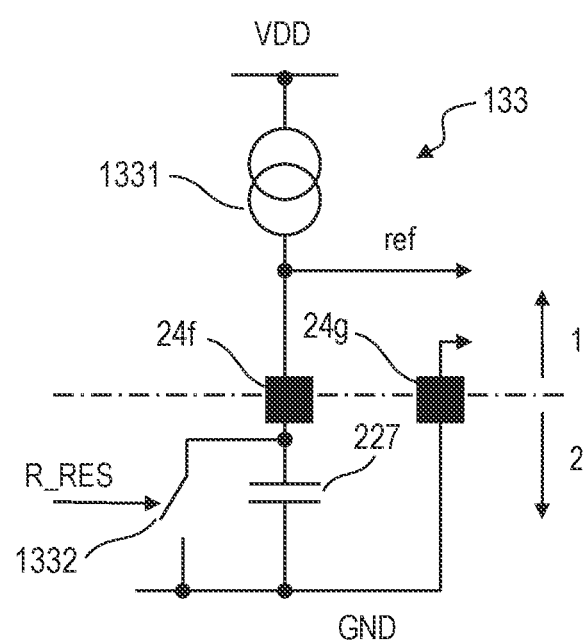
FIG. 16 is a schematic diagram of a reference signal generation circuit in the ninth embodiment of the present invention.

FIG. 16 is a schematic diagram of a reference signal generation circuit of the present embodiment. A reference signal generation circuit 133 generates a reference signal in a so-called slope-type analog-to-digital conversion unit. The reference signal generation circuit 133 includes a current source 1331, a reset switch 1332, and a charging capacitor (capacitor unit) 227. The current source 1331 is provided in the first semiconductor component 1 and formed of a transistor or the like. The charging capacitor 227 is provided in the second semiconductor component 2. By providing the charging capacitor 227 in a vacant region of the second semiconductor component 2, it is possible to form the overall apparatus in a small size. One electrode (first input node) of the charging capacitor 227 is connected to the current source 1331 via a junction contact 24f A current is supplied from the current source 1331 to the charting capacitor 227, and a reference signal ref in accordance with charges of the charging capacitor 227 is output. The other electrode (second input node) of the charging capacitor 227 is connected to the ground wiring GND of the second semiconductor component 2 and connected to the ground wiring GND of the first semiconductor component 1 via a junction contact 24g. The reset switch 1332 is provided in the second semiconductor component 2 and formed of a transistor. The reset switch 1332 is turned on or off in accordance with a control signal R_RES applied to the gate. When the reset switch 1332 is turned on, charges of the charging capacitor 227 are discharged to the ground wiring GND. Note that the reset switch 1332 may be provided in the first semiconductor component 1.

Figure 17:
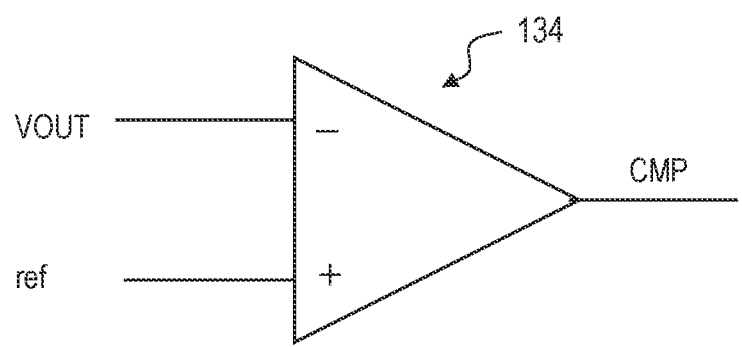
FIG. 17 is a diagram of a comparator circuit in the ninth embodiment of the present invention.

FIG. 17 is a diagram of a comparator circuit of the present embodiment. A comparator circuit 134 is formed of a differential amplifier and used in the analog-to-digital conversion unit. The reference signal ref is input to the non-inverting input terminal of the comparator circuit 134, and the signal VOUT that is an analog signal is input to the inverting input terminal. The comparator circuit 134 outputs a comparison signal CMP representing a result of comparison between the reference signal ref and the output signal VOUT. The counter circuit (not illustrated) measures a period (count value) before the comparison signal CMP is inverted and outputs the count value as a digital signal DOUT corresponding to the output signal VOUT that is an analog signal.

Figure 18:
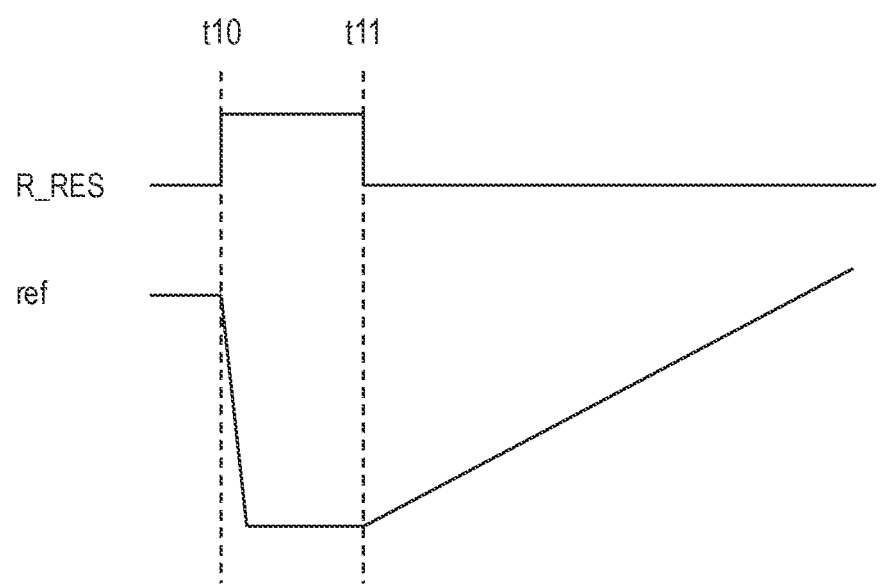
FIG. 18 is a timing chart illustrating an operation of a reference signal generation circuit in the ninth embodiment of the present invention.

FIG. 18 is a timing chart illustrating the operation of the reference signal generation circuit of the present embodiment. At time t10, the control signal R_RES is controlled to the high level, and the reset switch 1332 is turned on. In response to the reset switch 1332 being turned on, charges accumulated in the charging capacitor 227 are discharged, and the voltage of the reference signal ref of the reference signal generation circuit 133 becomes the GND potential. During time t10 to t11, since the control signal R_RES is at the high level, the reset switch 1332 is maintained to an on-state, and the current supplied from the current source 1331 continues to flow to the ground wiring GND via the reset switch 1332. At time t11, the control signal R_RES is controlled to the low level, the reset switch 1332 is turned off. Once the reset switch 1332 is turned off, the current supplied from the current source 1331 is charged in the charging capacitor 227. The amount of charges accumulated in the charging capacitor 227 increases as time elapses, and the voltage of the reference signal ref gradually increases.

Figure 19:
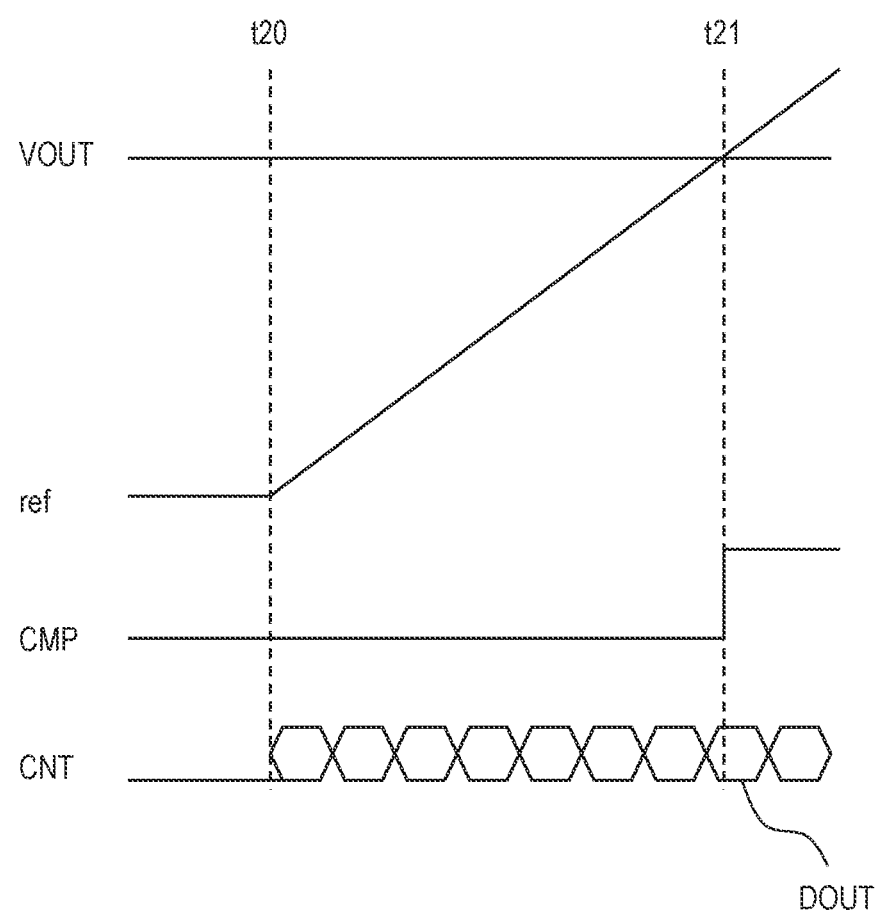
FIG. 19 is timing chart illustrating an operation of an analog-to-digital conversion unit in the ninth embodiment of the present invention.

FIG. 19 is a timing chart illustrating the operation of an analog-to-digital conversion unit of the present embodiment. At time t20, the reference signal generation circuit 133 starts increasing the voltage of the reference signal ref, and the counter circuit starts counting of clock pulses. At time t21, the relationship between the signal VOUT, which is an analog signal, and the reference signal ref is inverted, and the comparison signal CMP is inverted from the low level to the high level. The analog-to-digital conversion unit stores, in a memory unit, a count value CNT obtained at the time when the comparison signal CMP is inverted. This count value CNT is output as the digital signal DOUT corresponding to the signal VOUT that is an analog signal.

FIG. 20 is a schematic diagram of a current mirror circuit of the present embodiment. A current mirror circuit 135 is widely used as a current source circuit. The current mirror circuit 135 includes a current source 1351, transistors 1352, 1353, and 1354, and a capacitor 226. The current source 1351 and the transistors 1352, 1353, and 1354 are provided in the first semiconductor component 1, the capacitor 226 is provided in the second semiconductor component 2. One electrode (first input node) of the capacitor 226 is connected to the gates of the transistors 1352, 1353, and 1354 via a junction contact 24h. The other electrode (second input node) of the capacitor 226 is connected to the ground wiring GND of the second semiconductor component 2 and connected to the ground wiring GND of the first semiconductor component 1 via a junction contact 24i. Since the capacitor 226 is provided between the gates of the transistors 1352, 1353, and 1354 and the ground wiring GND, variation of the gate voltage due to noise or the like can be suppressed.

As described above, the present invention is also applicable to a generation circuit of a reference voltage other than a power source voltage, a generation circuit of a reference signal that changes with time, or a current mirror circuit. Also in the present embodiment, a capacitor that would otherwise be arranged outside a chip is arranged inside the chip, a capacitor outside the chip can be reduced. This enables a reduction in cost and a reduction in the area of a printed board.

Modified Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the present invention.

The present invention can also be realized by a process in which a program implementing one or more functions of the embodiments described above is supplied to a system or an apparatus via a network or a storage medium and then one or more processors in a computer of the system or the apparatus read and execute the program. Further, the present invention can be realized by using a circuit (for example, an ASIC) that implements one or more functions.

Note that all the embodiments described above are mere embodied examples in implementing the present invention, and the technical scope of the present invention should not be construed in a limiting sense by these embodiments. That is, the present invention can be implemented in various forms without departing from the technical concept or the primary feature thereof.

For example, the semiconductor apparatus in the present invention is not limited to the imaging apparatus and is applicable to various equipments. For example, the semiconductor apparatus of the present invention can be applied to an electronic equipment such as a camera, a mobile terminal, or a general purpose computer, a transport equipment such as an automobile, a ship, or an airplane, a communication equipment, an office equipment such as a copy machine, a printer, or a scanner, a display equipment such as a display, a medical equipment such as an X-ray diagnosis machine or an endoscope, an analysis equipment, or an industry equipment in general such as a semiconductor manufacturing equipment. Further, an apparatus that may be connected to the semiconductor apparatus of the present embodiment may include an image processing apparatus including an operation circuit, a control apparatus such as a power supply controller, a motor controller, or a robot controller, a storage apparatus using a semiconductor memory, a magnetic storage medium, or an optical storage medium, a display apparatus such as a liquid crystal display or an organic light emitting diode (OLED) display, or the like.

Further, while an example in which a capacitor unit is used as a bypass capacitor (decoupling capacitor) has been described in the above embodiments, the capacitor unit may be used for another use. For example, the capacitor unit may be used as a coupling capacitor (coupling capacitance) provided between signal lines.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-031801, filed Feb. 25, 2019, and Japanese Patent Application No. 2019-229328, filed Dec. 19, 2019, which are hereby incorporated by reference herein in their entirety.

What is claimed is:

1. A semiconductor apparatus comprising:
   a first semiconductor component in which a first circuit unit is provided, and including a first wiring layer region;
   a second semiconductor component in which a second circuit unit is provided and including a second wiring layer region and a main surface, which is stacked to the first semiconductor component so that the first wiring layer region and the second wiring layer region face each other;
   a junction contact portion made of a metal and connected to the first wiring layer region and the second wiring layer region;
   a pad electrode configured to be supplied one of a power source voltage and a ground voltage from outside of the semiconductor apparatus: and
   a capacitor unit connected to the pad electrode;
   wherein at least a part of the capacitor unit and the junction contact portion are overlapped each other in a plan view as viewed from above the main surface.

2. The semiconductor apparatus according to claim 1, wherein the second semiconductor component further includes a shield portion provided between the second circuit unit and the capacitor unit.

3. The semiconductor apparatus according to claim 1, wherein the capacitor unit is formed in a well isolated from the second circuit unit in a semiconductor substrate of the second semiconductor component.

4. The semiconductor apparatus according to claim 1, wherein the capacitor unit has MOS structure.

5. The semiconductor apparatus according to claim 4, wherein the capacitor unit further has a gate electrode, a source region, a drain region, and a substrate bias portion, and
   wherein the first node of the capacitor unit is connected to the gate electrode, and the second node of the capacitor unit is connected to the source region, the drain region, and the substrate bias portion.

6. The semiconductor apparatus according to claim 5, wherein the semiconductor region is arranged in the well, and
   wherein the first node of the capacitor unit is connected to the semiconductor region, and the second node of the capacitor unit is connected to the polysilicon electrode.

7. The semiconductor apparatus according to claim 1, wherein the capacitor unit includes a first metal wiring and a second metal wiring formed on a wiring layer region on a semiconductor substrate of the second semiconductor component, and wherein the first node of the capacitor unit is connected to the first metal wiring, and the second node of the capacitor unit is connected to the second metal wiring.

8. The semiconductor apparatus according to claim 7, wherein the first metal wiring and the second metal wiring are formed in different wiring layers.

9. The semiconductor apparatus according to claim 7, wherein the first metal wiring and the second metal wiring are formed in the same wiring layer.

10. The semiconductor apparatus according to claim 9, wherein each of the first metal wiring and the second metal wiring has a concave portion or a convex portion in plan view, and the convex portion of the second metal wiring is located in the concave portion of the first metal wiring.

11. The semiconductor apparatus according to claim 1, wherein the capacitor unit is arranged between the pad electrode and the second circuit unit in plan view.

12. The semiconductor apparatus according to claim 1 further comprising a plurality of capacitor units, wherein the plurality of capacitor units are connected to each other in parallel.

13. The semiconductor apparatus according to claim 1, wherein the capacitor unit and the first circuit unit are arranged so as to be at least partially overlapped in plan view.

14. The semiconductor apparatus according to claim 1, wherein the second circuit unit is a pixel unit including a photoelectric conversion unit.

15. The semiconductor apparatus according to claim 14, wherein the first circuit is an operation processing circuit.

16. The semiconductor apparatus according to claim 15, wherein the operation processing circuit performs a noise reduction processing.

17. The semiconductor apparatus according to claim 1, wherein the capacitor unit is arranged outside an area of the plurality of second circuit units in plan view.

18. The semiconductor apparatus according to claim 17, wherein the first semiconductor component includes a third circuit unit at least partially overlapping the second circuit unit in plan view.

19. The semiconductor apparatus according to claim 18, wherein the third circuit unit includes at least one of an analog-to-digital conversion unit that converts an analog signal output from the pixel unit into digital data and a memory unit that holds the digital data.

20. The semiconductor apparatus according to claim 19, wherein the first circuit unit is a digital signal processing circuit that processes the digital data.

21. The semiconductor apparatus according to claim 20, wherein the digital signal processing circuit outputs the digital data to an outside of the semiconductor apparatus.

22. The semiconductor apparatus according to claim 1, wherein the first node of the capacitor unit is connected to a power source line of the first circuit unit, and the second node of the capacitor unit is connected to a ground line of the first circuit unit.

23. The semiconductor apparatus according to claim 1, wherein the first circuit unit includes a voltage generation circuit that generates a reference voltage, and wherein the first node of the capacitor unit is connected to a wiring of the reference voltage, and the second node of the capacitor unit is connected to a ground line.

24. An equipment comprising:
the semiconductor apparatus according to claim 1; and
an apparatus connected to the semiconductor apparatus.

25. The semiconductor apparatus according to claim 14, wherein the first circuit is an analog-to-digital conversion circuit.

26. The semiconductor apparatus according to claim 14, wherein the first circuit unit is a digital signal processing circuit that processes digital data.

27. A semiconductor apparatus comprising:
a first semiconductor component in which a first circuit unit is provided, and including a first wiring layer region;
a second semiconductor component in which a second circuit unit is provided and including a second wiring layer region and a main surface, which is stacked to the first semiconductor component so that the first wiring layer region and the second wiring layer region face each other;
a junction contact portion made of a metal and connected to the first wiring layer region and the second wiring layer region;
a pad electrode configured to be supplied one of a power source voltage and a ground voltage from outside of the semiconductor apparatus; and
a capacitor unit connected to the pad electrode,
wherein the second semiconductor component includes the capacitor unit, and further includes a shield portion provided between the second circuit unit and the capacitor unit, and
wherein at least a part of the shield portion and the junction contact are not overlapped each other in a plan view as viewed from above the main surface.

28. The semiconductor apparatus according to claim 27, wherein the first semiconductor component comprises a transistor, and at least a part of the shield portion and the transistor are overlapped each other in a plan view as viewed from above the main surface.

29. The semiconductor apparatus according to claim 27, wherein the shield portion includes a plurality of wiring layers and a plurality of connection portions connecting the plurality of wiring layers to each other.

30. The semiconductor apparatus according to claim 27, wherein a fixed voltage is applied to the shield portion.

31. The semiconductor apparatus according to claim 27, wherein the capacitor unit is formed in a well isolated from the second circuit unit in a semiconductor substrate of the second semiconductor component.

32. The semiconductor apparatus according to claim 27, wherein the capacitor unit has MOS structure.

33. The semiconductor apparatus according to claim 27, wherein the capacitor unit is arranged between the pad electrode and the second circuit unit in plan view.

34. The semiconductor apparatus according to claim 27 further comprising a plurality of capacitor units, wherein the plurality of capacitor units are connected to each other in parallel.

35. The semiconductor apparatus according to claim 27, wherein the capacitor unit and the first circuit unit are arranged so as to be at least partially overlapped in plan view.

36. The semiconductor apparatus according to claim 27, wherein the second circuit unit is a pixel unit including a photoelectric conversion unit.

37. The semiconductor apparatus according to claim 36, wherein the first circuit is an operation processing circuit.

38. The semiconductor apparatus according to claim 36, wherein the first circuit is an analog-to-digital conversion circuit.

39. The semiconductor apparatus according to claim 27, wherein the capacitor unit is arranged outside an area of the plurality of second circuit units in plan view.

40. An equipment comprising:
the semiconductor apparatus according to claim 27; and
an apparatus connected to the semiconductor apparatus.

41. A semiconductor apparatus comprising:
a first semiconductor component in which a first circuit unit is provided, and including a first wiring layer region; and
a second semiconductor component including a first well including a second circuit unit and having a first conductivity type, a second well having the first conductivity type and a third well having a second conductivity type arranged between the first well and the second well, which is stacked to the first semiconductor component, and including a second wiring layer region and a main surface;
a junction contact portion made of a metal and connected to the first wiring layer region and the second wiring layer region;
a pad electrode configured to be supplied one of a power source voltage and a ground voltage from outside of the semiconductor apparatus; and
a capacitor unit connected to the pad electrode and arranged in the third well,
wherein at least a part of the third well and the junction contact portion are overlapped each other in a plan view as viewed from above the main surface.

42. The semiconductor apparatus according to claim 41, wherein the capacitor unit has MOS structure.

43. The semiconductor apparatus according to claim 41, wherein the capacitor unit is arranged between the pad electrode and the second circuit unit in plan view.

44. The semiconductor apparatus according to claim 41 further comprising a plurality of capacitor units, wherein the plurality of capacitor units are connected to each other in parallel.

45. The semiconductor apparatus according to claim 41, wherein the capacitor unit and the first circuit unit are arranged so as to be at least partially overlapped in plan view.

46. The semiconductor apparatus according to claim 41, wherein the second circuit unit is a pixel unit including a photoelectric conversion unit.

47. The semiconductor apparatus according to claim 46, wherein the first circuit is an operation processing circuit.

48. The semiconductor apparatus according to claim 46, wherein the first circuit is an analog-to-digital conversion circuit.

49. The semiconductor apparatus according to claim 41, wherein the capacitor unit is arranged outside an area of the plurality of second circuit units in plan view.

50. An equipment comprising:
the semiconductor apparatus according to claim 41; and
an apparatus connected to the semiconductor apparatus.

* * * * *